United States Patent
Li et al.

(10) Patent No.: US 9,379,422 B2
(45) Date of Patent: Jun. 28, 2016

(54) HYDROGEN-TREATED SEMICONDUCTOR METAL OXIDES FOR PHOTOELECTRICAL WATER SPLITTING

(71) Applicant: The Regents of the University of California, Oakland, CA (US)

(72) Inventors: Yat Li, Santa Cruz, CA (US); Gongming Wang, Santa Cruz, CA (US)

(73) Assignee: The Regents of the University of California, Oakland, CA (US)

( * ) Notice: Subject to any disclaimer, the term of this patent is extended or adjusted under 35 U.S.C. 154(b) by 107 days.

(21) Appl. No.: 13/915,487

(22) Filed: Jun. 11, 2013

(65) Prior Publication Data

US 2013/0337152 A1    Dec. 19, 2013

Related U.S. Application Data

(60) Provisional application No. 61/659,190, filed on Jun. 13, 2012.

(51) Int. Cl.

| | |
|---|---|
| *B05D 5/12* | (2006.01) |
| *H01M 14/00* | (2006.01) |
| *C25B 1/00* | (2006.01) |
| *B05D 3/04* | (2006.01) |
| *H01L 31/0224* | (2006.01) |
| *H01L 21/324* | (2006.01) |
| *B05D 3/02* | (2006.01) |

(52) U.S. Cl.
CPC ............. *H01M 14/005* (2013.01); *B05D 5/12* (2013.01); *C25B 1/003* (2013.01); *B05D 3/0209* (2013.01); *B05D 3/04* (2013.01); *B05D 2202/30* (2013.01); *H01L 21/324* (2013.01); *H01L 31/0224* (2013.01); *Y02E 60/368* (2013.01); *Y02P 20/135* (2015.11)

(58) Field of Classification Search
USPC .................... 427/74, 379; 438/104, 795, 796
See application file for complete search history.

(56) References Cited

U.S. PATENT DOCUMENTS

| | | | | |
|---|---|---|---|---|
| 4,215,155 | A | * | 7/1980 | McKinzie ............... C25B 1/003 427/126.3 |
| 4,511,638 | A | * | 4/1985 | Sapru ..................... C25B 1/003 136/258 |
| 4,524,091 | A | * | 6/1985 | Blaauw et al. .................. 427/74 |
| 5,677,240 | A | * | 10/1997 | Murakami et al. ............ 438/609 |
| 8,871,670 | B2 | * | 10/2014 | Seebauer ............... B82Y 30/00 502/300 |
| 2011/0127167 | A1 | * | 6/2011 | Misra ..................... B82Y 30/00 205/200 |
| 2013/0020113 | A1 | * | 1/2013 | Corbea ..................... H01B 1/08 174/257 |

FOREIGN PATENT DOCUMENTS

JP       2008-108805       *  5/2008

* cited by examiner

*Primary Examiner* — Brian K Talbot
(74) *Attorney, Agent, or Firm* — Lumen Patent Firm

(57) ABSTRACT

A method of electrode hydrogenation for photoelectrochemical (PEC) water oxidation is provided that includes annealing a PEC electrode in air, and annealing the PEC electrode in hydrogen to form a hydrogenated-PEC electrode, where PEC performance is improved by enhancing charge transfer and transport in the hydrogenated-PEC electrode.

7 Claims, 23 Drawing Sheets

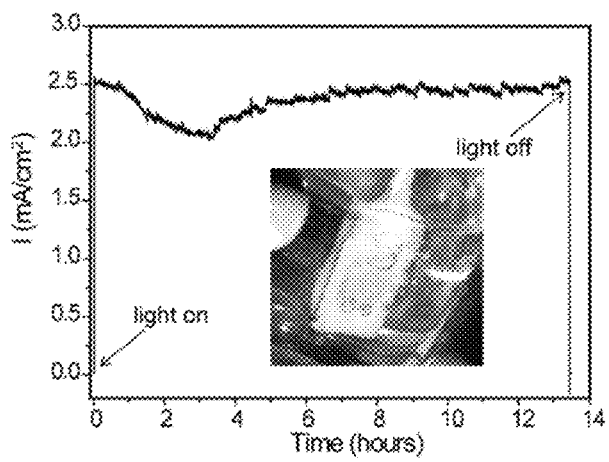
FIG. 7
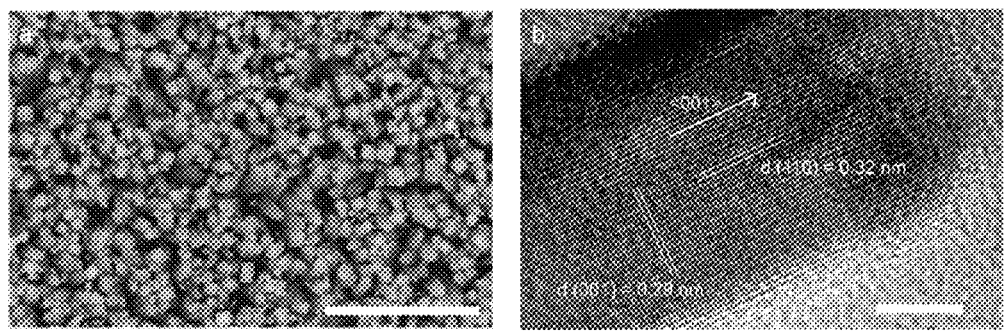
FIG. 8a  FIG. 8b
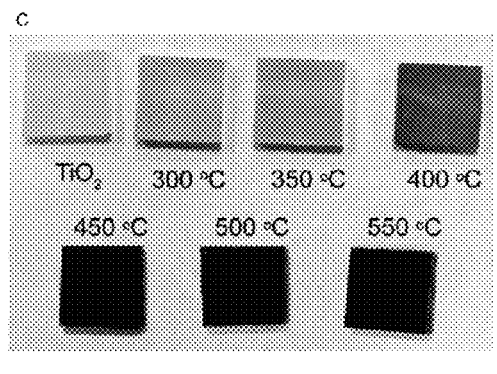 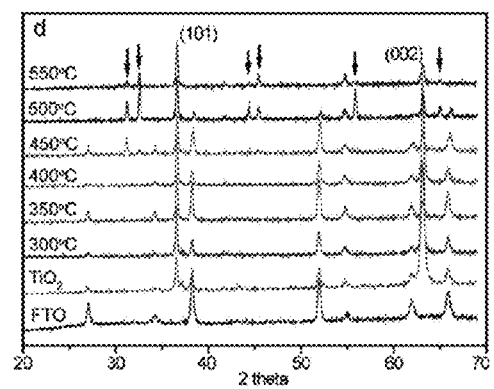
FIG. 8c  FIG. 8d

HYDROGEN-TREATED SEMICONDUCTOR METAL OXIDES FOR PHOTOELECTRICAL WATER SPLITTING

CROSS-REFERENCE TO RELATED APPLICATIONS

This application claims priority from U.S. Provisional Patent Application 61/659,190 filed Jun. 13, 2012, which is incorporated herein by reference.

STATEMENT OF GOVERNMENT SPONSORED SUPPORT

This invention was made with Government support under contract DMR 0847786 awarded by National Science Foundation. The Government has certain rights in this invention.

FIELD OF THE INVENTION

The present invention relates generally to photoelectrochemical (PEC) water splitting. More particularly, the invention relates to hydrogen thermal treatment to fundamentally improve the performance for PEC water splitting.

BACKGROUND OF THE INVENTION

Photoelectrochemical (PEC) water splitting for solar hydrogen production has attracted extensive interest in the last few decades. Titanium dioxide ($TiO_2$) has been extensively investigated as a photoanode for photoelectrochemical (PEC) water splitting because of its favorable band-edge positions, strong optical absorption, superior chemical stability and photocorrosion resistance, and low cost. However, the STH efficiency of $TiO_2$ is substantially limited by its large band gap energy and usually fast electron-hole recombination due to a high density of trap states. An enormous amount of research has been focused on enhancing the visible light absorption of large band gap metal oxides. For instance, sensitization with small band gap semiconductors and/or band gap narrowing via elemental doping are two versatile approaches shown to improve the conversion efficiency of metal oxide photoelectrodes by modifying their optical absorption coefficient and wavelength. On the other hand, it is equally important to fundamentally improve the morphology and electronic structure of $TiO_2$ for effective separation and transportation of photoexcited charge carriers. It has been predicted that a maximum photoconversion efficiency of 2.25% can be achieved by rutile $TiO_2$ with an optical band gap of 3.0 eV, at 100 mW/$cm^2$ AM 1.5 global illumination. Yet, the reported photocurrent densities and photoconversion efficiencies of $TiO_2$ photoanodes are substantially lower than the theoretical limit.

Additionally, $WO_3$ as a photoanode material has attracted extensive attention due to its favorable bandgap. However, photoelectrochemical instability is a major hurdle for the $WO_3$ photoanode, as the peroxo-species generated in water oxidation cause photocorrosion of $WO_3$. An effective approach to stabilize $WO_3$ is to deposit a layer of oxygen evolution catalyst to reduce oxygen evolution overpotential and therefore suppress the formation of peroxo species. However, a thick catalyst layer will sacrifice the photoactivity of $WO_3$ by blocking the light penetration.

Further, zinc oxide (ZnO) has been extensively studied for photocatalytic hydrogen evolution because it has favorable band-edge positions that straddle the redox potential of water photoelectrolysis, and it is of low cost and environmentally friendly. Nevertheless, the efficiency of ZnO for photocatalytic hydrogen evolution is limited (200-2000 $\mu mol\ h^{-1}\ g^{-1}$) by its wide band-gap and rapid recombination of photo-generated carriers. Moreover, the excessive aggregation of ZnO powder photocatalysts in water causes substantial reduction of active surface area, and thus decreases the catalytic performance and utilization of ZnO.

What is needed is a treatment that can significantly enhance the photoconversion efficiency of $BiVO_4$, $TiO_2$, $WO_3$ and ZnO materials by improving their donor density and electrical conductivity.

SUMMARY OF THE INVENTION

To overcome the teachings in the art, a method of electrode hydrogenation for photoelectrochemical (PEC) water oxidation is provided that includes annealing a PEC electrode in air, and annealing the PEC electrode in hydrogen to form a hydrogenated-PEC electrode, where PEC performance is improved by enhancing charge transfer and transport in the hydrogenated-PEC electrode.

According to one aspect of the invention, the electrode is a photoanode.

In another aspect of the invention, the hydrogenated-PEC electrode can be hydrogenated-$TiO_2$, hydrogenated-$WO_3$, hydrogenated-$BiVO_4$, or hydrogenated-ZnO.

In a further aspect of the invention, the air-annealing of the PEC electrode is in a range of 500 to 550° C.

According to another aspect of the invention, the hydrogen-annealing of the PEC electrode includes a temperature in a range of 200 to 500° C.

In yet another aspect of the invention, the hydrogen-annealing of the PEC electrode includes a hydrogen atmosphere having a purity of at least 99.99%.

In a further aspect of the invention, the hydrogen-annealing of the PEC electrode includes a hydrogen atmosphere having a pressure in a range of 500 to 760 milli-torr.

In another aspect of the invention, the air-annealing of the PEC electrode includes an air atmosphere having a pressure in a range of 500 to 760 mili-torr.

According to one aspect of the invention, the hydrogen-annealing of the PEC electrode includes annealing for a duration in a range of 10 min to 2 h.

In yet another aspect of the invention, the air-annealing of the PEC electrode includes annealing for a duration in a range of 1 h to 3 h.

BRIEF DESCRIPTION OF THE DRAWINGS

FIG. 7. shows photostability of H—$BiVO_4$ collected at 1.0 V vs Ag/AGCl in 0.5 M $Na_2SO_4$ solution for 13 h. The inset shows the gas evolution on the H—$BiVO_4$ photoelectrode under light illumination.

FIGS. 8a-8d. show (a) SEM image of vertically aligned TiO2 nanowire arrays prepared on a FTO substrate. Scale bar is 4 μm. (b) Lattice-resolved TEM image of a single $TiO_2$ nanowire. Scale bar is 5 nm. (c) Digital pictures and (d) XRD spectra of pristine $TiO_2$ and H:$TiO_2$ nanowires annealed in hydrogen at various temperatures (300, 350, 400, 450, 500, and 550° C.). XRD spectrum of FTO substrate is added as reference. Arrows in (d) highlight the diffraction peaks corresponding to Sn metal, according to embodiments of the invention.

DETAILED DESCRIPTION

Figure 1:
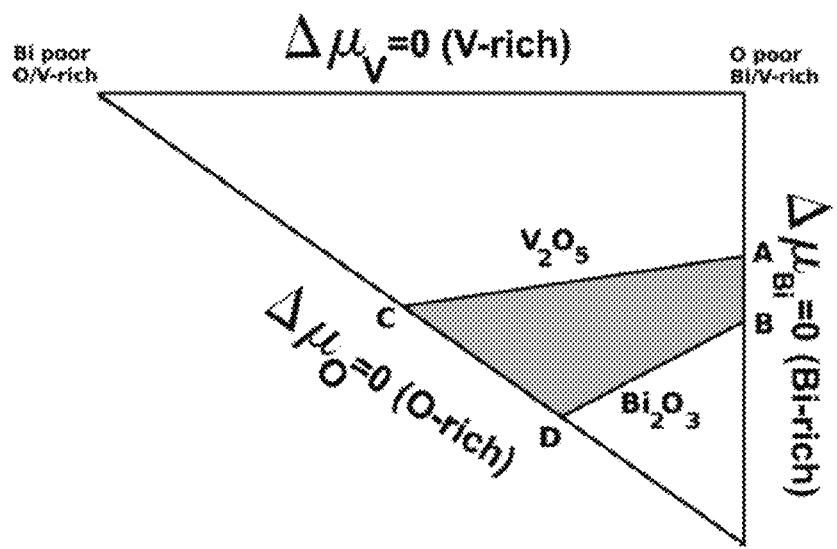
FIG. 1. shows a range of possible stoichiometric regimes (shaded area) for the atomic chemical potentials of bismuth, vanadium, and oxygen to sustain stable growth of $BiVO_4$, according to one embodiment of the invention.
Figure 2:
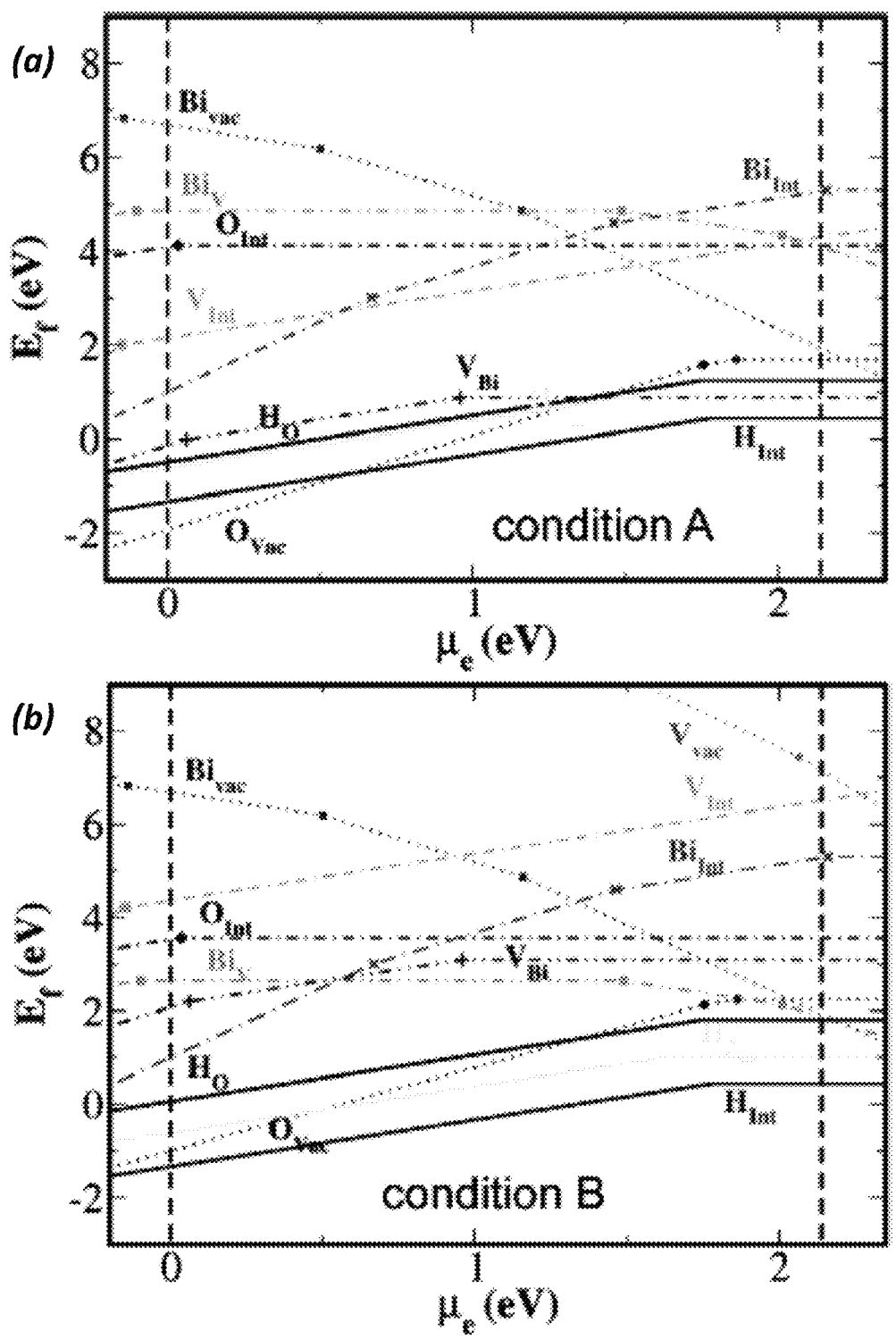
FIGS. 2a-2d show plots of formation energies of defects in $BiVO_4$ versus the electron chemical potential (fermi level) for conditions A to D indicated in FIG. 1. Vacancies are indicated by dotted lines, self-interstitials are indicated by dashed lines and antisites by dot-dashed lines. H-related defects are indicated by solid lines. The specific element related to these defects is indicated next to the corresponding curve. Condition A corresponds to oxygen-poorest, Bi rich; condition B is intermediate V/O-poor and Bi rich; condition C is bismuth-poorest, O-rich; and condition D is V poorest, O-rich. The vertical dashed lines indicate the calculated band-edges of the crystal (EVBM set to 0). The slope of the curves indicate the charge state and the kinks in the curves indicate transition of charge states, according to embodiments of the invention.
Figure 2:
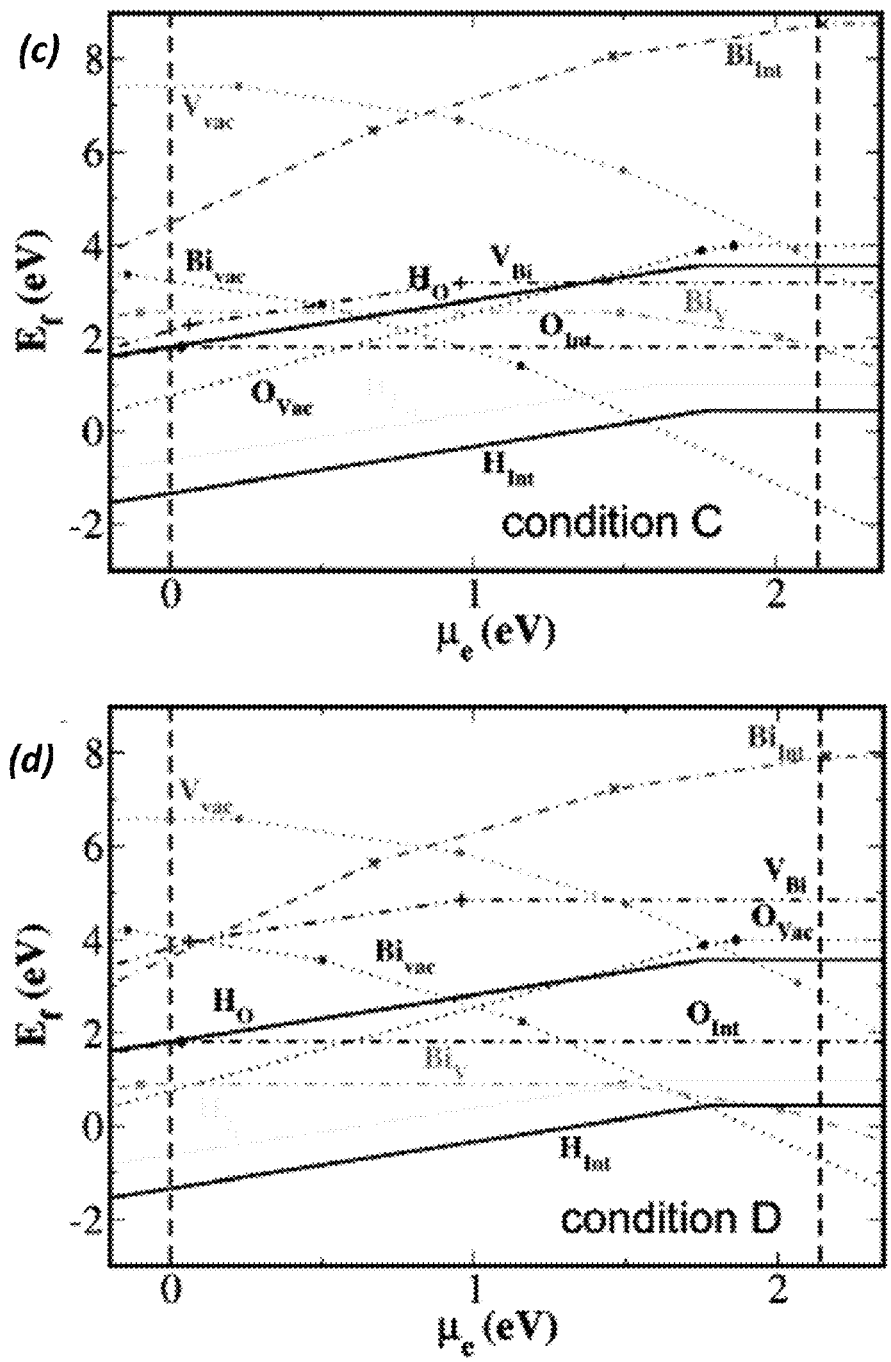

The current invention includes a method of electrode hydrogenation for photoelectrochemical (PEC) water oxidation that includes annealing a PEC electrode in air, and annealing the PEC electrode in hydrogen to form a hydrogenated-PEC electrode, where PEC performance is improved by enhancing charge transfer and transport in the hydrogenated-PEC electrode. According to the embodiments of the invention, the hydrogenated-PEC electrode can be hydrogenated-$BiVO_4$, hydrogenated-$TiO_2$, hydrogenated-$WO_3$, or hydrogenated-ZnO.

According to one embodiment, a hydrogenation method is used to significantly enhance the performance of $BiVO_4$ films for photoelectrochemical water oxidation, where hydrogenation was performed for $BiVO_4$ films by annealing them in hydrogen atmosphere at elevated temperatures between 200 and 400° C. Hydrogen gas can reduce $BiVO_4$ to form oxygen vacancies as well as hydrogen impurities. In one aspect density functional theory (DFT) calculations predicted that both oxygen vacancies and hydrogen impurities are shallow donors for $BiVO_4$ with low formation energies. These defects increase the donor densities of $BiVO_4$ without introducing deep trap states. Electrochemical impedance measurements show that the donor densities of $BiVO_4$ films are significantly enhanced upon hydrogenation. Hydrogen-treated $BiVO_4$ (H—$BiVO_4$) photoanodes achieved a maximum photocurrent density of 3.5 mA/cm² at 1.0 V vs Ag/AgCl, which is 1 order of magnitude higher than that of air-annealed $BiVO_4$ obtained at the same potential. The enhanced photoactivities were attributed to increased donor densities of H—$BiVO_4$, which facilitates the charge transport and collection.

According to one embodiment, $BiVO_4$ is a direct band gap ternary metal oxide semiconductor with a favorable band gap of 2.3-2.5 eV for solar light absorption. Furthermore, its conduction band is close to 0 V versus RHE at pH 0, as a result of the overlap of empty Bi 6p orbitals with antibonding V 3d-O 2p states, which can reduce the need for external bias for PEC water splitting. However, charge transport and the interfacial charge transfer have been found to be key limiting factors for its PEC performance.

According to the current invention, hydrogen treatment significantly enhances the PEC performance of $TiO_2$ and $WO_3$ photoanodes by increasing their carrier densities via the formation of oxygen vacancies, which act as shallow donors. The enhancement of $BiVO_4$ is due to the substantially increased donor density as a result of formation of oxygen vacancies and hydrogen impurities.

To provide guidance to experimental studies, parameter-free quantum simulations based on DFT were performed investigating the effects of hydrogen treatment on the electronic properties of $BiVO_4$. A monoclinic primitive cell of symmetry C62h composed of two units of $BiVO_4$ (16 atoms) was used. The optimized lattice parameters were 7.323, 11.786, 5.173 Å with an angle of 134.85° between the non-orthogonal lattice vectors, in good agreement with previous experimental and theoretical reports. The band structure of $BiVO_4$ has several direct and indirect transitions from local valence band maxima to local conduction band minima that are close in energy.

Experimental measurements indicated a direct gap of energy between 2.4 and 2.5 eV. It was found that a band gap of 2.14 eV with the highest filled states formed by binding combinations of O 2p and Bi s orbitals, whereas the lowest empty states are formed predominantly by d orbitals from vanadium. The supercells used for defect calculations are 2°-2°-2 repetitions of the primitive cell with a total of 96 atoms. Several sites were tested for the incorporation of interstitial H atoms in the structure of $BiVO_4$.

Little variation in the formation energy of these defects on different sites and no appreciable difference in the electronic properties was observed. Interstitial molecular hydrogen was tested, which can also be incorporated because of the fairly open crystal structure of $BiVO_4$.

Furthermore, H atoms in association with oxygen vacancies were tested. To assess the relative frequency of the hydrogen related defects to the intrinsic ones, an extensive analysis of the latter including vacancies and self-interstitials of Bi, V, and O, as well as BiV and VBi antisites were conducted. The formation energies are given by the expression:

$$E_f = E_d - (E_p - \mu_r + \mu_a) + q(E_{VBM} + \mu_e) \quad (1)$$

where $E_{d,p}$ are the total energies of the supercells containing the defect, and the pristine one, respectively, $\mu_{r,a}$ is the atomic chemical potential of the elements removed or added to the defect, q is the charge state considered for the defect, and $\mu_e$ is the potential of the reservoir with which the system exchanges electrons or holes (Fermi level). The value of the atomic chemical potentials $\mu_{r,a}$ depends on the stoichiometric regime under which the crystal is formed. To sustain conditions for the formation of the desired compound, certain conditions must be kept: (i) the chemical potential of each element must not be larger than the chemical potential of the bulk element, (ii) the sum of the variation of the chemical potentials of each element relative to their bulk phases ($\Delta\mu$) must equal the heat of formation of the compound, which is defined as $\Delta H_{abc} = \mu_{abc} - \mu_a^B - \mu_b^B - \mu_c^B$, where the superscript B indicates the value of the bulk phase; (iii) the atomic chemical potentials of the elements forming the compound and impurities must be such that the formation of competing phases, such as $Bi_2O_3$ or $V_2O_5$, is prevented in the present case. In equations, these conditions can be summarized as follows:

$$\Delta\mu_{Bi,V,O} = \mu_{Bi,V,O} - \mu_{Bi,V,O}^B \leq 0 \quad (i)$$

$$\Delta H_{BiVO_4} = \Delta\mu_{Bi} + \Delta\mu_V + 4\Delta\mu_O \quad (ii)$$

$$2\Delta\mu_{Bi} + 3\Delta\mu_O \leq \Delta H_{Bi_2O_3}; 2\Delta\mu_{Bi} + 5\Delta\mu_O \leq \Delta H_{V_2O_5} \quad (iii)$$

These conditions determine the phase space of atomic chemical potentials for Bi, V, and O under which it is possible to synthesize $BiVO_4$ crystals as indicated by the shaded area in FIG. 1. Whereas additional competing phases can be considered, $V_2O_5$ and $Bi_2O_3$ are enough to give a reliable estimate of the phase space of allowed chemical potentials. The upper boundary in FIG. 1 is given by the equations: $\Delta\mu_V = ((\Delta H_{V_2O_5} - 5\Delta H_O)/2)$ and $\Delta\mu_{Bi} = \Delta H_{BiVO_4} - ((\Delta H_{V_2O_5})/2) - ((3\Delta\mu_O)/2)$; so that point A in FIG. 1 corresponds to the condition in equilibrium with Bi bulk ($\Delta\mu_{Bi}=0$, bismuth rich) the poorest in oxygen possible ($\Delta\mu_O = -2.307$, $\Delta\mu_V = -1.384$ eV).

Point C is oxygen rich, $\Delta\mu_O = 0$, but is the poorest possible condition in bismuth, with $\Delta\mu_{Bi} = -3.46$ and $\Delta\mu_V = -7.15$ eV.

The lower boundary of the shaded area in FIG. 1 is defined by the conditions: $\Delta\mu_{Bi} = ((\Delta H_{Bi_2O_3} - 3\Delta\mu_O)/2)$; $\Delta\mu_V = \Delta H_{BiVO_4} - ((\Delta H_{Bi_2O_3})/2) - ((5\Delta\mu_O)/2)$. Point B corresponds to equilibrium with Bi bulk but is less oxygen poor than point A: $\Delta\mu_{Bi}=0$, $\Delta\mu_O=-1.752$, $\Delta\mu_V=-3.6$ eV. Finally, point D corresponds to the condition poorest in vanadium, with $\Delta\mu_O=0$, $\Delta\mu_{Bi}=-2.63$, $\Delta\mu_V=-7.98$ eV. Because many defects involving hydrogen were considered, its atomic chemical potential from $H_2$ gas was also calculated, which is $\mu H = -3.35$ eV, taken as constant in all conditions (always hydrogen rich).

The formation energies of the intrinsic and hydrogen-related defects in $BiVO_4$ were calculated using eq (1) for the conditions indicated by points A, B, C, and D in FIG. 1. To minimize the effect of spurious electrostatic interactions in charged defect calculations due to the periodic cell approximation, the Makov-Payne correction were included by evaluating the Ewald energy of a point charge in the supercell screened by the dielectric constant of $BiVO_4$, which was calculated as 7.48, 6.28, and 7.48 $\in_0$ along the three lattice vectors. The upper limit for these corrections for the supercell varies from 0.3 eV for singly charged defects to 10.8 eV for defects of charge 6.

FIGS. 2a-2d demonstrate several important features. First, all three H-related defects studied are positively charged throughout most of the band gap of $BiVO_4$, and therefore they are shallow donors of electrons to the crystal. Second, the formation energy of interstitial atomic H atoms in $BiVO_4$ is lower than that of any intrinsic defect in $BiVO_4$ through most of the gap of the system in any stoichiometric condition. The other H-related defects are also fairly low in formation energy relative to the intrinsic defects. Third, for O-rich crystals (conditions C and D) shown in FIGS. 2c and 2d, the presence of Bi vacancies, which are acceptors, becomes significant reducing the net concentration of free electrons in the conduction band despite the presence of the shallow hydrogen donors. These defects also introduce a transition state near the middle of the band gap (EVBM+1 eV), which indicates the presence of a trap state detrimental to the transport properties that we want to enhance for the purpose of the photoelectrochemical cell. Therefore, oxygen-deficient crystal (conditions A and B) in FIGS. 2b and 2b upon hydrogen treatment should result in a material with optimal properties for PEC water oxidation.

Figure 3:
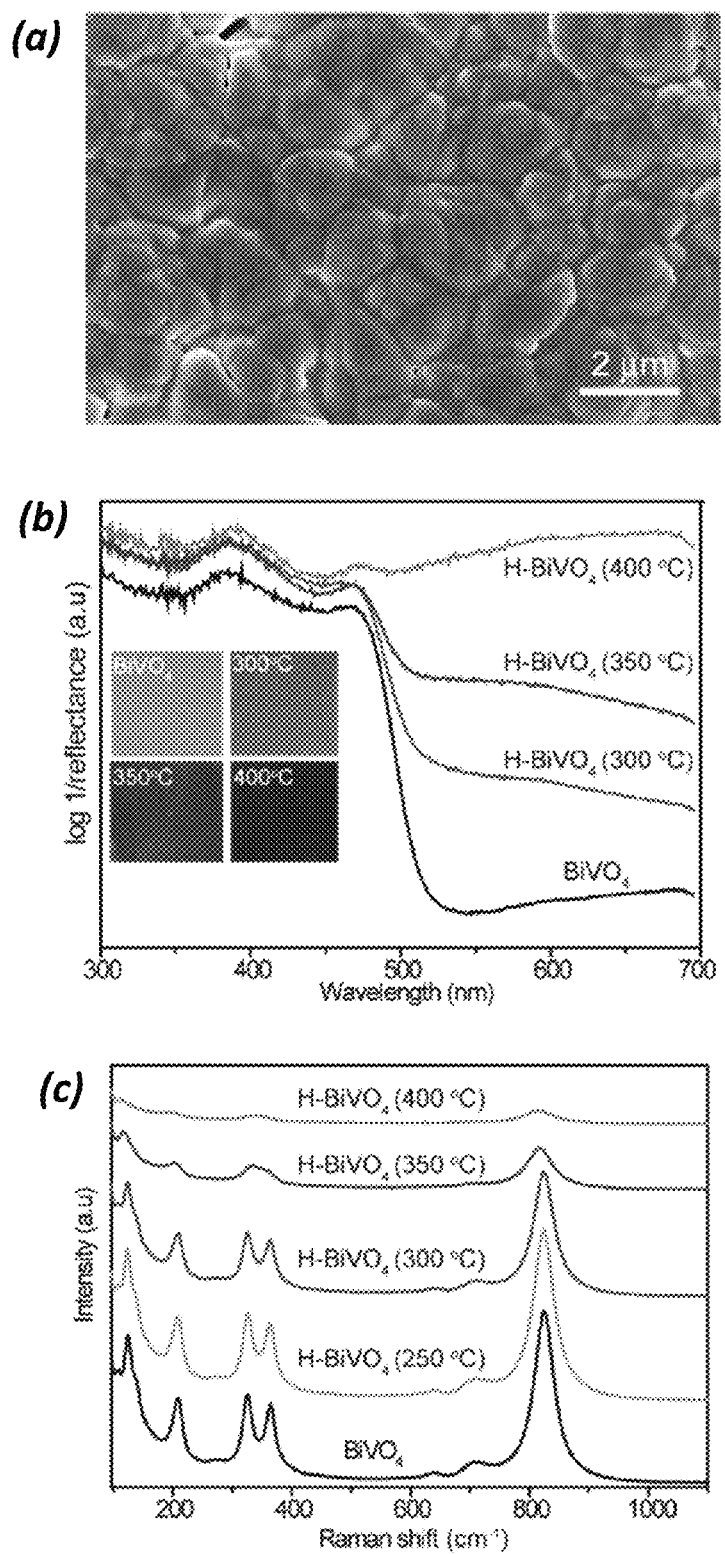
FIGS. 3a-3c show (a) SEM image of BiVO4 film annealed in air at 550° C. for 2 h. (b) Diffuse reflectance UV-visible spectra collected for airannealed BiVO4 film and H—BiVO4 films annealed at 300, 350, and 400° C. Inset shows the pictures of these films. (c) Raman spectra collected for air-annealed BiVO4 film and H—BiVO4 annealed at temperatures in a range between 250 and 400° C., according to embodiments of the invention.

FIGS. 3a-3c show the range of possible stoichiometric regimes (shaded area) for the atomic chemical potentials of bismuth, vanadium, and oxygen to sustain stable growth of BiVO4. To prove this and provide experimental confirmation of the DFT simulation results, the effect of hydrogenation on the PEC performance of $BiVO_4$ photoelectrodes was studied. $BiVO_4$ films were fabricated on fluorine-doped tin oxide (FTO) glass substrate using a seed-mediated hydrothermal method. As shown in FIG. 3a, the FTO substrate was uniformly coated with $BiVO_4$ particles. The cross sectional image revealed the thickness of the seed layer and $BiVO_4$ particle film are around 2-3 µm. Raman analyses indicated that the as-prepared sample is monoclinic $BiVO_4$, and its crystal phase remained unchanged upon calcination. The calcined $BiVO_4$ films were further annealed in hydrogen atmosphere in a tube furnace. Air-annealed $BiVO_4$ is bright yellow in color. Upon hydrogenation, it turned to yellowish green and eventually dark green as annealing temperature increased. To quantitatively analyze the color changes, diffuse reflectance UV-vis spectra for air-annealed $BiVO_4$ and hydrogen-treated $BiVO_4$ (denoted as H—$BiVO_4$) samples were collected. All of the samples exhibited strong UV and visible light absorption. The $BiVO_4$ sample showed an abrupt absorption onset at around 530 nm, which is consistent with its optical band gap of 2.3-2.4 eV. In contrast, H—$BiVO_4$ samples showed enhanced visible light absorption at wavelengths beyond 530 nm, which could be attributed to electronic transitions between defect states and band-edge states. The UV-vis spectral results are consistent with the observed color change for H—$BiVO_4$ samples. To determine the effect of hydrogenation on the structure of $BiVO_4$, the X-ray diffraction (XRD) spectra and Raman spectra were compared for $BiVO_4$ and H—$BiVO_4$ samples. $BiVO_4$ and H—$BiVO_4$ samples exhibited similar XRD diffraction peaks, which can be indexed to monoclinic $BiVO_4$. There is no apparent change of crystal phase during hydrogenation. Furthermore, these samples exhibited characteristic Raman peaks for monoclinic $BiVO_4$ (see FIG. 3c). Note that the H—$BiVO_4$ samples showed considerably broader Raman peaks compared to $BiVO_4$, and the peak broadening becomes more substantial with the increase of hydrogen annealing temperature. The peak broadening is indicative of the degradation of material crystallinity, which could be attributed to the formation of defects such oxygen vacancies and hydrogen impurities, as predicted by the computational studies.

Figure 4:
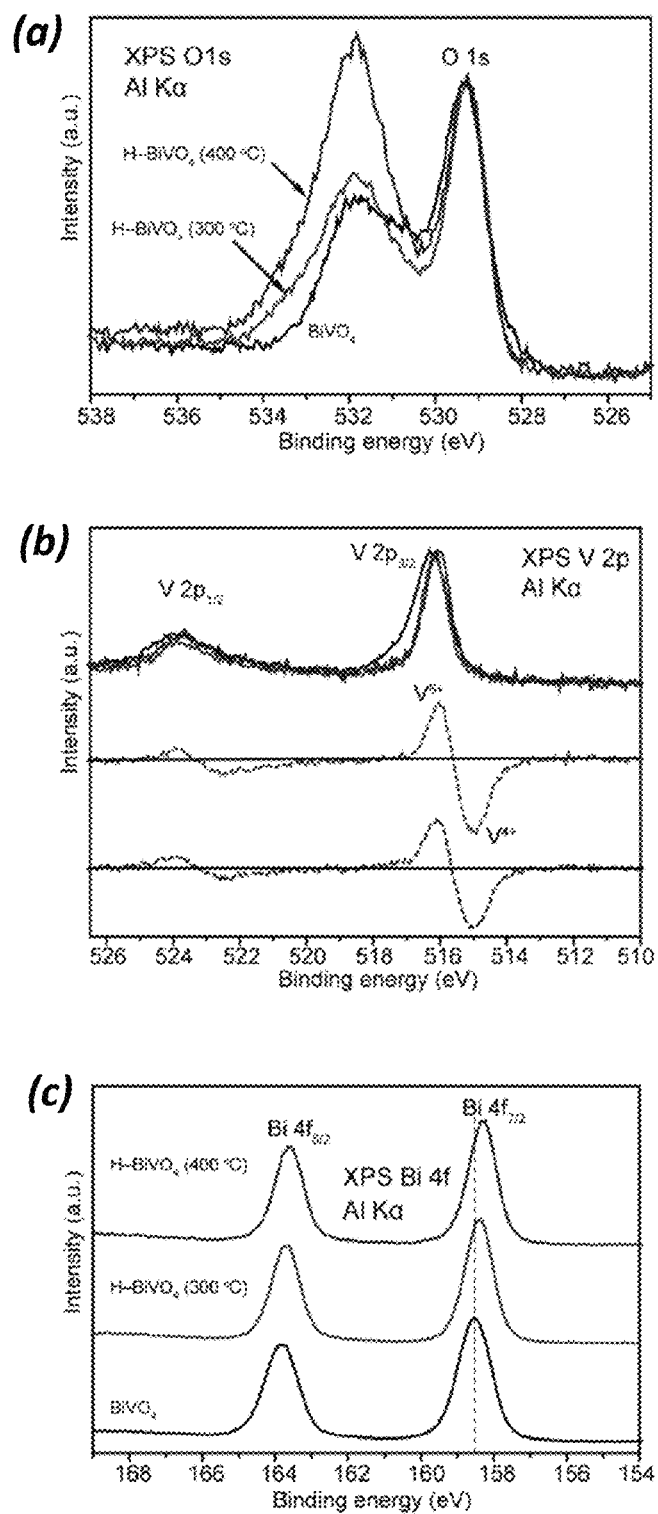
FIGS. 4a-4c. show (a) Overlay of normalized O 1s XPS spectra of BiVO4 (black) and H—BiVO4 samples annealed at 300 and 400° C. (b) (top) overlay of normalized V 2p XPS spectra of $BiVO_4$, H—$BiVO_4$ samples annealed at 300 and 400° C.; (middle) difference spectrum between H—$BiVO_4$ (300° C.) and $BiVO_4$; (bottom) difference spectrum between H—$BiVO_4$ (400° C.) and $BiVO_4$. (c) Core level Bi 4f XPS spectra of $BiVO_4$ and H—$BiVO_4$, according to embodiments of the invention.

X-ray photoelectron spectroscopy (XPS) was carried out to characterize the modification on the chemical states of the $BiVO_4$ surface upon hydrogenation. The XPS spectra of $BiVO_4$ and H—$BiVO_4$ are essentially the same. Sn and Na peaks are most likely originated from the FTO layer and the glass substrate, respectively. Carbon is believed to be incorporated during sample preparation and subsequent handling. FIG. 4a shows the core-level O 1s XPS spectra of $BiVO_4$ and H—$BiVO_4$ annealed at 300 and 400° C. They exhibited two distinct peaks centered at 529.4 and 531.8 eV. The O 1s binding energy of 529.4 eV peak is consistent with the typical value reported for $BiVO_4$. The peak at 531.8 eV can be ascribed to the O—H bonds. The H—$BiVO_4$ sample prepared at 400° C. showed a significantly stronger signal at 531.8 eV indicating the increased density of hydroxyl groups on the BiVO$_4$ surface as a result of hydrogenation. To balance the overall charge of the crystal, BiVO$_4$ is likely to form extra hydroxyl groups on the surface, which would lead to the creation of oxygen vacancies. FIG. 4b shows the core-level V 2p XPS spectra of these samples. The binding energies of the V 2p$_{3/2}$ and V 2p$_{1/2}$ lines of BiVO$_4$ and H—BiVO$_4$ are found at 524 and 516.3 eV, which are consistent with the reported values for BiVO$_4$. The V 2p lines of H—BiVO$_4$ samples are slightly shifted to lower binding energy, which is indicative of the presence of V4+ species that usually appears at the binding energy 1.1 eV lower than the V$^{5+}$ 2p$_{3/2}$ line. To identify the tiny amount of V$^{4+}$ (which correlates with oxygen vacancies), the difference spectra between H—BiVO$_4$ samples (300 and 400° C.) and BiVO$_4$ (FIG. 4b). The peaks at the binding energies of 515.0 and 516.1 eV can be attributed to V$^{4+}$ 2p$_{3/2}$ line and V$^{5+}$ 2p$_{3/2}$ line, respectively. The V$^{4+}$ 2p$_{3/2}$ line located at a binding energy of 1.1 eV lower than the V$^{5+}$ 2p$_{3/2}$ line is consistent with the values previously reported. FIG. 4c shows the core-level Bi 4f XPS spectra of BiVO$_4$ and H—BiVO$_4$. The Bi 4f$_{5/2}$ and Bi 4f$_{7/2}$ lines are found at the binding energies of 163.9 and 158.5 eV, respectively. In comparison to BiVO$_4$, the Bi 4f$_{5/2}$ and Bi 4f$_{7/2}$ lines of H—BiVO$_4$ also showed a shift of 0.2 eV toward lower binding energy suggesting the reduction of Bi$^{3+}$ to lower oxidation states. These XPS results clearly support the hypothesis that oxygen vacancies were created in H—BiVO$_4$ samples upon hydrogenation.

Figure 5:
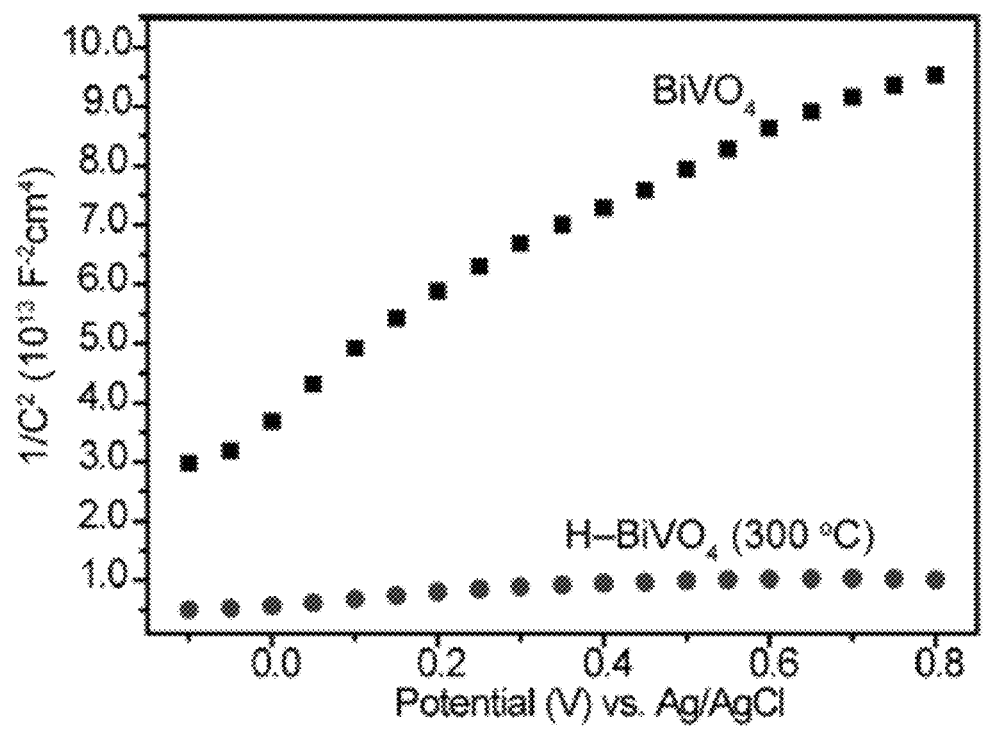
FIG. 5. Show Mott-Schottky plots collected on $BiVO_4$ and H—$BiVO_4$ (300° C.) in the dark with a frequency of 10 kHz, according to one embodiment of the invention.

According to the simulation results, both oxygen vacancies and hydrogen impurities are shallow donors for BiVO$_4$. The donor densities of BiVO$_4$ samples are demonstrated using electrochemical impedance spectroscopy (EIS). Electrochemical impedance was measured for BiVO$_4$ and H—BiVO$_4$ samples using a CHI 660D electrochemical station with 5 mV perturbation and a frequency range from 1 Hz to 100 kHz at different potentials. Mott-Schottky plots were generated for BiVO$_4$ and H—BiVO$_4$ annealed at 300° C. from capacitances obtained from the EIS spectra at each potential with a frequency of 10 kHz (FIG. 5). Both samples showed positive slopes, as expected for n-type semiconductor. Because the Mott-Schottky plot was developed based on a planar electrode model, the deviation from a linear profile is commonly observed when it is used for nanostructured electrode. The linear region of the Mott-Schottky profile in the range of between 0.2 and 0.6 V versus Ag/AgCl was chosen to calculate the slope and donor density. In comparison to BiVO$_4$, the H—BiVO$_4$ showed a considerably smaller slope indicating a significantly enhanced donor density. The carrier density of BiVO$_4$ and H—BiVO$_4$ (300° C.) were calculated to be 6°—1014 cm$^{-3}$ and 6.08°—1015 cm$^{-3}$, respectively. Whereas the calculation may have errors in determining the absolute value of donor density, however, the comparison of the donor densities between the pristine BiVO$_4$ and H—BiVO$_4$ is reasonable. The increased donor density is consistent with the simulation results, which predicted that oxygen vacancies and hydrogen impurities are shallow donors for BiVO$_4$. More importantly, the increased donor density could improve the PEC performance of BiVO$_4$ by enhancing charge transfer at the interface of BiVO$_4$ and FTO substrate. Electrochemical impedance spectroscopic measurements were also carried out to study the charge transfer at the semiconductor/electrolyte interface. The H—BiVO$_4$ electrode showed a much smaller semicircular arc in Nyquist plot indicating more efficient charge transfer at the interface. By fitting the Nyquist curves, the charge transfer resistances were estimated to be around 19 394 and 2256Ω for pristine BiVO$_4$ and H—BiVO$_4$, respectively.

Figure 6:
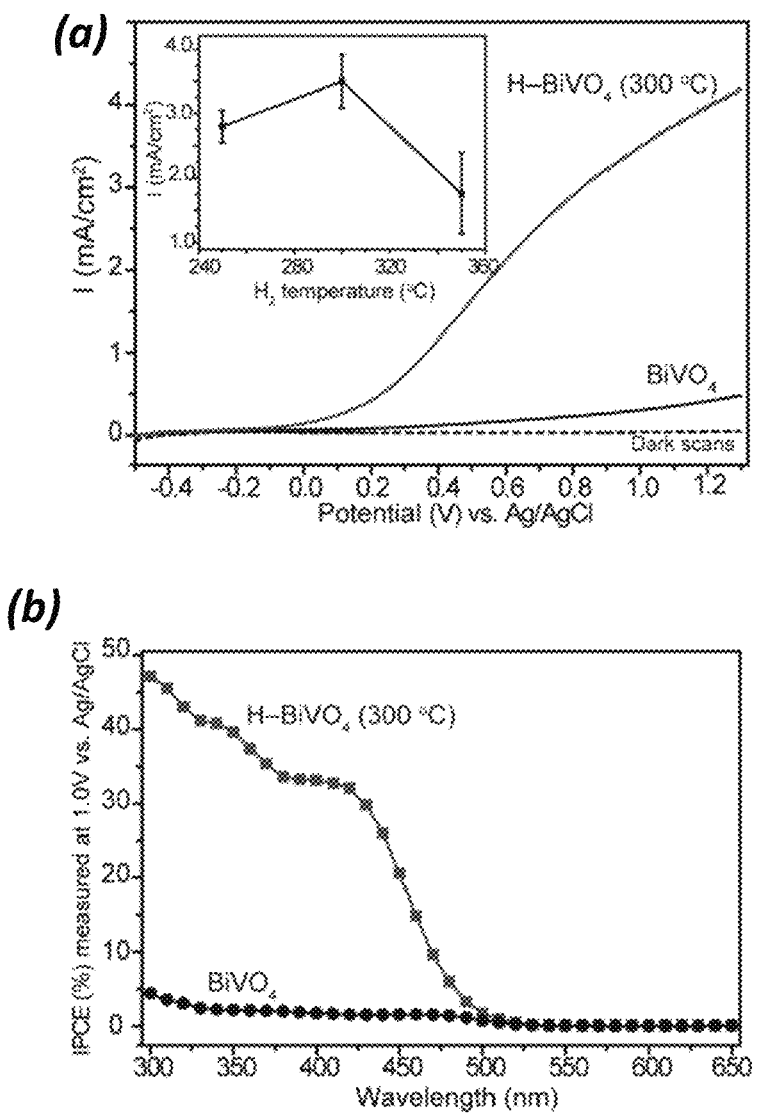
FIGS. 6a-6b. show (a) Linear sweep voltammograms collected for $BiVO_4$ and H—$BiVO_4$, under illumination of simulated solar light of 100 mW/cm$^{-2}$ (150 W xenon lamp coupled with an AM1.5G filter). Inset shows the photocurrent densities measured at 1.0 V vs Ag/AgCl for H—BiVO4 samples annealed at temperatures in a range between 200 and 350° C. The error bar represents the standard deviation calculated on 4 samples. (b) IPCE spectra collected for BiVO4 and H—$BiVO_4$ at the potential of 1.0 V vs Ag/AgCl, with incident wavelengths between 300 and 650 nm.

The PEC properties of BiVO$_4$ and H—BiVO$_4$ were measured with a goal of correlating their optical and electronic properties with the PEC performance. FIG. 6a shows linear sweep voltammograms collected for BiVO$_4$ and H—BiVO$_4$ annealed at 300° C. Photocurrent density of the H—BiVO$_4$ sample is substantially higher than the BiVO$_4$ sample in the whole range of potentials studied. The H—BiVO$_4$ sample achieved a maximum photocurrent density of 3.5 mA/cm$^2$ at 1.0 V vs Ag/AgCl, which is an order of magnitude higher than that of BiVO$_4$ (0.3 mA/cm$^2$) measured at the same potential. The inset in FIG. 6a shows the photocurrent densities measured for H—BiVO$_4$ samples at 1.0 V versus Ag/AgCl as a function of annealing temperatures. The photocurrent density gradually increases when the annealing temperature was increased from 250 to 300° C. and reached an optimal value of 3.5 mA/cm$^2$. Then the photocurrent density decreases with further increase of temperature beyond 300° C., which could be due to the degradation of FTO substrates, as well as the occurrence of defects such as Bi vacancies that possibly introduce trap states into the band gap of BiVO$_4$ as predicted by the computational studies.

To study the interplay between photoactivity and light absorption of H—BiVO$_4$ photoanodes, their incident-photon-to-current-conversion efficiency (IPCE) spectra were also measured. IPCE spectra collected for BiVO$_4$ and H—BiVO$_4$ at 1.0 V versus Ag/AgCl showed a gradual decrease of photoactivity from 300 to 530 nm with a cutoff wavelength around 530 nm (FIG. 6b), which is consistent with the band gap of BiVO$_4$ (2.3-2.4 eV). Importantly, the results also indicate that there is no photoactivity beyond 530 nm, even though the H—BiVO$_4$ samples have absorption in the entire visible light region (confirmed by UV-vis results). The light absorption at wavelength beyond 530 nm could be due to electronic transitions involving defect levels, which do not seem to directly contribute to photocurrent generation. In comparison to BiVO$_4$, H—BiVO$_4$ showed significantly enhanced photo-activity in the wavelength region between 300 and 500 nm, which is believed to be due to the improved electrical conductivity of H—BiVO$_4$, and thus, the increased efficiency in charge transfer and collection. Finally, the long-term stability of H—BiVO$_4$ electrodes were tested. FIG. 7 shows the photo-current retention collected for H—BiVO$_4$ sample at 1.0 V versus Ag/AgCl. The electrode retains 99% of the initial photocurrent after 13 h. It proved that the introduction of oxygen vacancies and hydrogen impurities does not affect the electrochemical stability of BiVO$_4$ electrode. We observed continuous evolution of gas bubbles on H—BiVO$_4$ electrode (inset of FIG. 7) suggesting the observed photocurrent is not due to self-oxidation of the photoelectrode. The initial decrease of photocurrent and the small photocurrent fluctuation could be due to the formation of gas bubbles on electrode surface. On the whole, these results unabmigously show that H—BiVO$_4$ electrode has excellent photostability for water oxidation.

Turning now to hydrogen-treated TiO$_2$ (H:TiO$_2$), a demonstration of hydrogen treatment as an effective strategy to fundamentally improve the performance of TiO$_2$ nanowires for photoelectrochemical (PEC) water splitting is provided, according to one embodiment of the invention. Hydrogen-treated rutile TiO$_2$ (H:TiO$_2$) nanowires were prepared by annealing the pristine TiO$_2$ nanowires in hydrogen atmosphere at various temperatures in a range of 200-550° C. In comparison to pristine TiO$_2$ nanowires, H:TiO$_2$ samples show substantially enhanced photocurrent in the entire potential window. More importantly, H:TiO$_2$ samples have exceptionally low photocurrent saturation potentials of −0.6 V vs Ag/AgCl (0.4 V vs RHE), indicating very efficient charge separation and transportation. The optimized H:TiO$_2$ nanowire sample yields a photocurrent density of ~1.97 mA/cm$^2$ at −0.6 V vs Ag/AgCl, in 1 M NaOH solution under the illumination of simulated solar light (100 mW/cm² from 150 W xenon lamp coupled with an AM 1.5G filter). This photocurrent density corresponds to a solar-to-hydrogen (STH) efficiency of ~1.63%. After eliminating the discrepancy between the irradiance of the xenon lamp and solar light, by integrating the incident-photon-to-current-conversion efficiency (IPCE) spectrum of the H:TiO₂ nanowire sample with a standard AM 1.5G solar spectrum, the STH efficiency is calculated to be ~1.1%, which is the best value for a TiO₂ photoanode. IPCE analyses confirm the photocurrent enhancement is mainly due to the improved photoactivity of TiO₂ in the UV region. Hydrogen treatment increases the donor density of TiO₂ nanowires by 3 orders of magnitudes, via creating a high density of oxygen vacancies that serve as electron donors. Similar enhancements in photocurrent were also observed in anatase H:TiO₂ nanotubes. The capability of making highly photoactive H:TiO₂ nanowires and nanotubes opens up new opportunities in various areas, including PEC water splitting, dye-sensitized solar cells, and photocatalysis.

According to on embodiment, the invention includes, increased PEC performance in TiO₂ nanostructures using increased donor density. One-dimensional nanowire-arrayed photoanode with large surface area and short diffusion distance for photogenerated minority carriers facilitate the charge separation and, thus, reduce the loss due to electron-hole recombination. Additionally, some dopants such as nitrogen and carbon serve as electron donors, according to different embodiments of the invention. The dopants introduce impurity states in various positions in the band gap of TiO₂ and lead to different degrees of modification in electrical conductivity. Oxygen vacancies are known to be shallow donors for rutile TiO₂, with relatively low formation energies. Oxygen vacancies play a critical role in determining the surface and electronic properties of TiO₂. According to one embodiment, annealing TiO₂ nanostructures in a reducing gas atmosphere substantially increases the density of oxygen vacancies (donor density) and, thereby, enhance the electrical conductivity as well as charge transportation. To show this, hydrogen-treated TiO₂ (denoted as H:TiO₂) nanowire arrays (rutile) and nanotube arrays (anatase) are described. Hydrogen gas was chosen because it is a reducing gas with very light-weight that may facilitate diffusion of the gas into TiO₂. In comparison to other reducing agents, ultra-high-purity hydrogen as low as 99.99% (preferably 99.999%) can also avoid the possibility of integrating dopants from the reducing agent or solvent into the TiO₂ structure. Until now, hydrogen-treated TiO₂ one-dimensional nanostructures (nanowires and nanotubes) have not been reported for PEC water splitting.

Rutile TiO₂ nanowire arrays were prepared on a fluorine-doped tin oxide (FTO) glass substrate by a hydrothermal method. Scanning electron microscopy (SEM) image reveals that the white, homogeneous film obtained on the FTO substrate consists of dense and vertically aligned nanowire arrays (FIG. 8a). These nanowires are uniform with a rectangular cross section. The nanowire diameters are in the range of 100-200 nm and the typical nanowire lengths are 2-3 µm. Transmission electron microscopy (TEM) analysis shows that each individual nanowire observed under SEM is indeed consisting of a bundle of smaller nanowires, which have diameters of 10-20 nm. A lattice-resolved TEM image collected from the small nanowire reveals clear lattice fringes with interplanar spacings of 0.32 and 0.29 nm, which are consistent with the d-spacings of (110) and (001) planes of rutile TiO₂ (FIG. 8b). These data further confirm the single-crystalline structure and demonstrate that the TiO₂ nanowires grow along the <001> direction.

The as-prepared TiO₂ nanowire arrays were first annealed in air at 550° C. for 3 h, followed by annealing in hydrogen atmosphere for an additional 30 min, at various temperatures in a range of 200-550° C. As shown in FIG. 8c, the color of the H:TiO₂ nanowire films depends on the hydrogen annealing temperature; it changes from white (untreated sample) to yellowish green (350° C.) and finally to black (450° C. or above). The dark color observed suggests that the TiO₂ has visible light absorption as a result of hydrogen treatment. The black color was ascribed to the surface disorder of TiO₂ nanoparticles. In this work, we studied the photoactivity of H:TiO₂ nanowires annealed at different temperatures for PEC water splitting as a function of wavelength, in order to understand the interplay between the light absorption and PEC performance.

To determine the crystal structure and possible phase changes during hydrogen annealing, X-ray diffraction (XRD) spectra were collected from the pristine TiO₂ nanowires and H:TiO₂ nanowire arrays prepared at various annealing temperatures (FIG. 8d). After subtracting the diffraction peaks from FTO glass, two diffraction peaks centered at 2" angles of 36.5° and 63.2° were observed in every sample. These two sharp peaks are indexed to the characteristic peaks of tetragonal rutile TiO₂, and thus confirm the as-prepared nanowires are rutile TiO₂. The peak centered at 63.2° corresponds to the (002) diffraction which is dominant over the (101) peak providing evidence that the TiO₂ nanowires are highly oriented in the <001> direction on the FTO substrate, which is consistent with the observed growth axis of TiO₂ nanowires. As shown in FIG. 8d, there is no phase change after hydrogenation, although the TiO₂ peak intensity decreases with the increase of the annealing temperature. This can be due to the increase of defect density in TiO₂ structure, which has also been observed in the recent study of hydrogenated TiO₂ nanoparticles. In addition, the diffraction peaks of FTO glass gradually disappeared and a group of new peaks (highlighted by arrows) corresponding to Sn metal emerged when annealing temperature was higher than 450° C. It indicates that the hydrogen treatment at high temperature damaged the FTO conducting layer by reducing SnO₂ to Sn metal.

Figure 9:
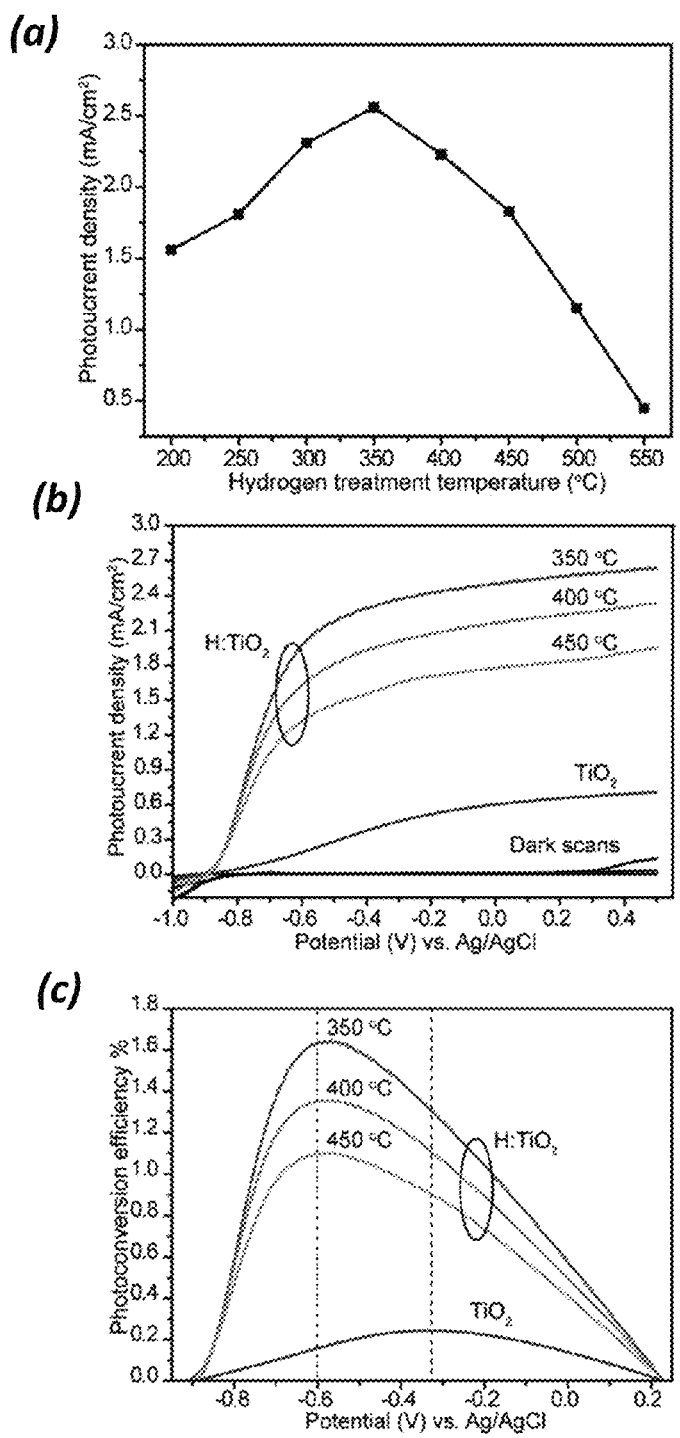
FIGS. 9a-9c. show (a) Measured photocurrent density for H:TiO2 nanowires at 0.23 V vs Ag/AgCl (1.23 V vs RHE) as a function of hydrogen annealing temperature, in a 1M NaOH solution with a scan rate of 50 mV/s under 100 mW/cm$^2$ illumination. (b) Linear sweeps voltammogram collected from pristine TiO$^2$ nanowires and H:$TiO_2$ nanowires annealed at temperatures of 350° C., 400° C., and 450° C. (c) Calculated photoconversion efficiencies for the pristine $TiO_2$ and H:$TiO_2$ nanowire samples, as a function of applied potential vs Ag/AgCl. The dashed lines highlight the optimal potentials for each sample, according to embodiments of the invention.

The photocurrents of colored H:TiO₂ nanowire-arrayed photoanodes as a function of annealing temperatures were studied and compared to those of the pristine TiO₂ nanowires. The nanowire samples were fabricated into photoanodes with a well-defined area of 0.2-0.25 cm². All PEC and impedance measurements were performed in a three-electrode electrochemical system, using a Ag/AgCl reference electrode and a Pt wire as the counter electrode. Linear sweeps were collected for H:TiO₂ nanowires in 1MNaOH electrolyte (pH=13.6), under simulated sunlight illumination at 100 mW/cm² from a 150 W xenon lamp coupled with an AM 1.5G filter. FIG. 9a shows that the photocurrent densities of H:TiO₂ nanowires, obtained at a potential bias of 0.23 V vs Ag/AgCl [1.23 V vs reversible hydrogen electrode (RHE)], increase gradually with the increase of the hydrogen annealing temperature from 200 to 350° C. The H:TiO₂ nanowires prepared at 350° C. yield a maximum photocurrent density of ~2.5 mA/cm² at 0.23 V vs Ag/AgCl. This is comparable to the best reported value of ~2.8 mA/cm² for TiO² photoanodes measured by the same type of xenon lamp coupled to an AM 1.5G filter at 100 mW/cm² irradiance. The photocurrent density of H:TiO² nanowires decreases, as the annealing temperatures was further increased above 350° C. Beyond the possible effect of hydrogen treatment, one of the reasons is due to the increased resistance of FTO substrate from 25Ω at 350° C. to 64Ω at 400° C. and 165Ω at 450° C. This is consistent with the XRD analysis that the FTO layer degrades at temperatures of 450° C. or above.

To show the effect of hydrogen treatment on the PEC performance of $TiO_2$, FIG. 9b compares the linear sweeps of pristine $TiO_2$ with $H:TiO_2$ nanowire samples prepared at 350° C., 400° C., and 450° C., in a potential range of −1.0 to 0.5 V vs Ag/AgCl. By analyzing these data, we reached two important conclusions. First, the photo-current densities of $H:TiO_2$ nanowire samples are at least two times higher than that of pristine $TiO_2$ nanowires in the entire potential windows we studied. It confirms that hydrogen treatment is a simple and effective method for enhancing the PEC performance of $TiO_2$. Second, the photocurrent density of pristine $TiO_2$ sample increases gradually with the applied potential and reaches a saturated current of 0.6 $mA/cm^2$ at 0 V vs Ag/AgCl (FIG. 9b). In contrast, all $H:TiO_2$ samples show a drastic increase in photocurrent density at an onset potential of −0.9 V vs Ag/AgCl, and the photocurrent saturated at a substantially lower potential of −0.4 V vs Ag/AgCl (0.6 V vs RHE). The negative shift of saturation potential indicates that the charge separation and transportation in the $H:TiO_2$ samples are more efficient, compared to the pristine $TiO_2$ nanowires.

Achieving a low photocurrent onset and saturation potential is extremely important because it reduces the applied bias required to achieve the maximum photocurrent and, thus, increases the overall efficiency of PEC hydrogen generation. The STH efficiencies (η) of nanowire-arrayed photoanodes were calculated using the equation $$\eta = I(1.23 - V)/J_{light}$$

where V is the applied bias vs RHE, I is the photocurrent density at the measured bias, and $J_{light}$ is the irradiance intensity of 100 $mW/cm^2$ (AM 1.5G). The calculated STH efficiency as a function of the applied bias are plotted in FIG. 9c. The pristine $TiO_2$ sample exhibits an optimal conversion efficiency of 0.24% at −0.33 V vs Ag/AgCl. Significantly, the yellow $H:TiO_2$ (350° C.) sample achieves the highest efficiency of ~1.63% at a very low bias of −0.6 V vs Ag/AgCl (0.4 V vs RHE). This is the best STH efficiency achieved by $TiO_2$ materials to date. Likewise, the $H:TiO_2$ samples annealed at 400 and 450° C. exhibit the optimal efficiency of ~1.35 and 1.08% at a similar applied bias. Hydrogen treatment substantially enhances the photoconversion efficiency of $TiO_2$ nanowires by improving the maximum photocurrent and reducing the current saturation potential.

Figure 10:
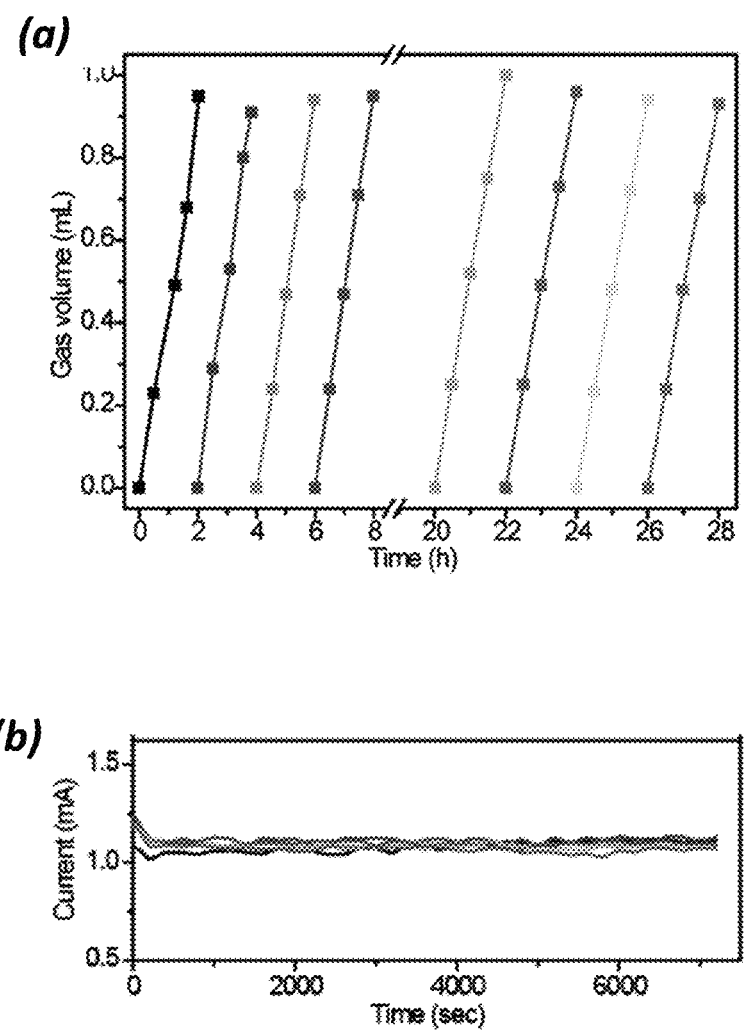
FIGS. 10a-10b show (a) Measured gas production of the H:$TiO_2$ nanowires annealed at 350° C. under at −0.6 V vs Ag/AgCl as a function of time, in a 1 M NaOH solution under 100 mW/cm$^2$ illumination. (b) The corresponding photocurrent-time profiles obtained for the H:$TiO_2$ nanowire photoanode during the gas collection cycles, according to embodiments of the invention.

The hydrogen generation and the stability of $TiO_2$ nanowire-arrayed photoanodes were investigated. Under light illumination (100 $mW/cm^2$), gas production at both photoanode and Pt cathode was observed. FIG. 10a shows the collected gas volume as a function of time. The gas collection device (1 mL syringe) was replaced every 2 h under light illumination, which is counted as one gas collection cycle. After four cycles, the device was kept in the dark for 12 h, and restarted the gas collection for an additional four cycles. Importantly, the gas production shows a linear relation with illumination time in the entire 16 h measurement, suggesting gas production is persistent for continuous operation. In addition, FIG. 10b shows the measured photocurrents for the $H:TiO_2$ nanowire photoanode during each gas production cycles are nearly the same, supporting that the $H:TiO_2$ nanowires are very stable in the process. GC analysis demonstrates the collected gas is composed of $H_2$ and $O_2$; however, we were not able to get a quantitative $H_2/O_2$ ratio due to the instrumental limitation. The gas production rate is calculated to be ~0.47 mL/h at an applied bias of −0.6 V vs Ag/AgCl. Due to design of the gas collection device, the nanowire samples were illuminated from the backside. As a result, a significant portion of UV light was absorbed by the FTO glass substrate, and it was observed the halved photocurrent density compared to the front side illumination. On the basis of the photocurrent obtained from the back side illumination, the theoretical gas production rate is calculated to be ~0.67 mL/h. It is lower than the experimental data due to the back reaction of oxygen reduction on Pt electrode and possible gas leakage, which can be solved by a better design of the gas collection device.

Figure 11:
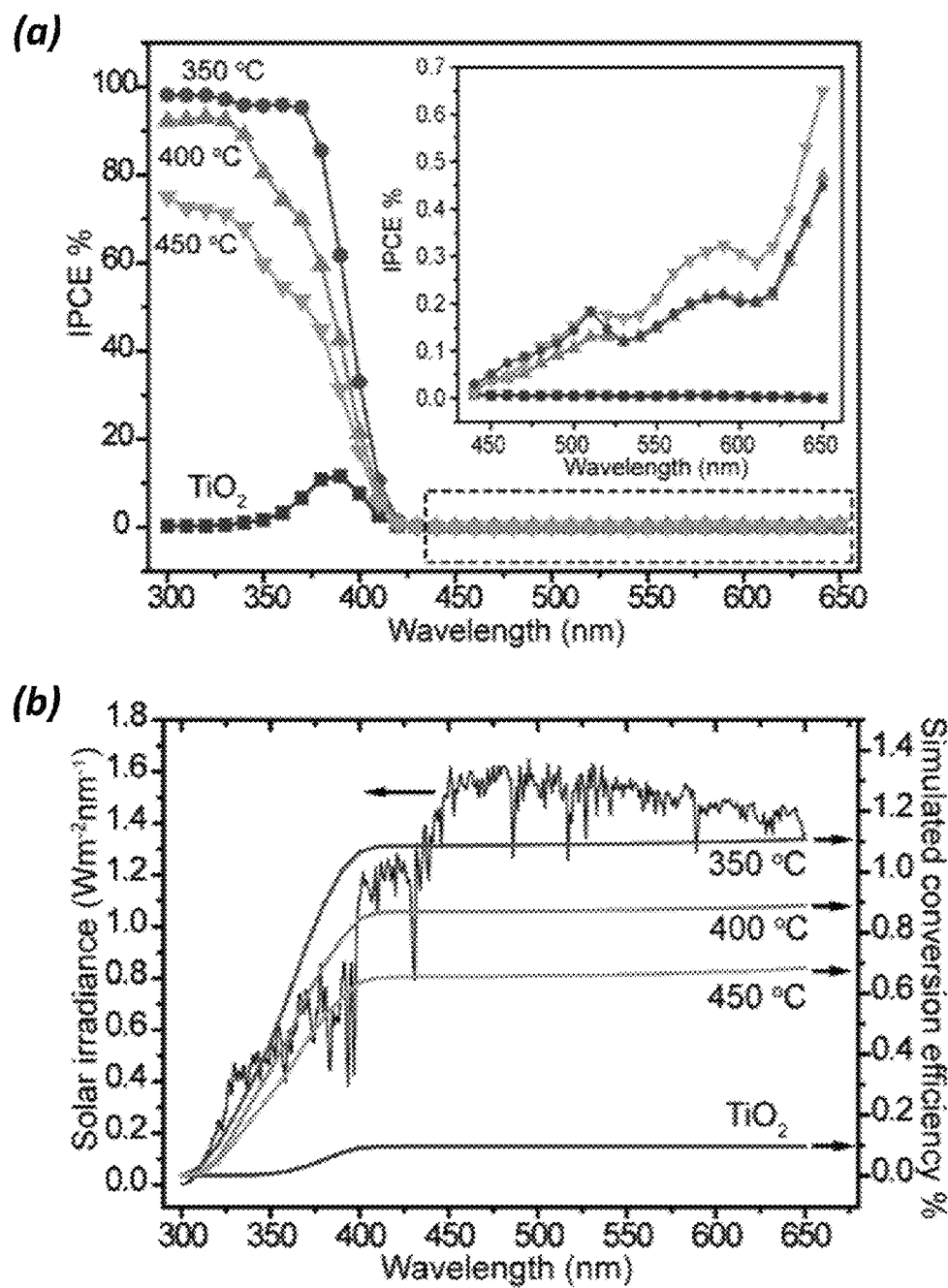
FIGS. 11a-11b. show (a) IPCE spectra of pristine $TiO_2$ and H:$TiO_2$ nanowires prepared at 350, 400, and 450° C., collected at the incident wavelength range from 300 to 650 nm at a potential of −0.6 V vs Ag/AgCl. Inset: Magnified IPCE spectra that highlighted in the dashed box, at the incident wavelength range from 440 to 650 nm. (b) Simulated STH efficiencies for the pristine $TiO_2$ and H:$TiO_2$ nanowires as a function of wavelength, by integrating their IPCE spectra collected at −0.6 V vs Ag/AgCl with a standard AM 1.5G solar spectrum (ASTM G-173-03), according to embodiments of the invention.

To understand the interplay between the photoactivity and the light absorption of $H:TiO_2$ nanowires prepared at various annealing temperatures (different colors), their photoactivity as a function of wavelength of incident light was quantitatively investigated. In comparison to photocurrent density obtained under white light illumination, incident-photon-to-current-conversion efficiency (IPCE) is a better parameter to characterize the photoconversion efficiency of different photoanodes because it is independent from the light sources and filters used in the measurement. IPCE measurements were performed on pristine $TiO_2$ and $H:TiO_2$ nanowire-arrayed photoanodes at −0.6 V vs Ag/AgCl (FIG. 11a). IPCE can be expressed by the equation $$IPCE = (1240I)/(\lambda J_{light})$$

where I is the measured photocurrent density at a specific wavelength, λ is the wavelength of incident light, and $J_{light}$ is the measured irradiance at a specific wavelength. In comparison to pristine $TiO_2$ nanowires, all $H:TiO_2$ nanowires exhibit significantly enhanced photoactivity over the entire UV region. Particularly, the $H:TiO_2$ nanowire sample annealed at 350° C. has the IPCE values uniformly higher than 95% in the wavelength range from 300 to 370 nm. It indicates that the UV light was effectively used for PEC water splitting, in which the separation and transportation of photoexcited charge carriers are very efficient in the $H:TiO_2$ nanowires. The IPCE values decrease gradually from ~95% at 370 nm to ~1% at 420 nm, which is consistent with the band gap energy (3.0 eV) of rutile $TiO_2$. Significantly, we observed small photoactivity in the visible light region for the $H:TiO_2$ nanowire samples, whereas the IPCE values increase slowly from almost zero at 440 nm to 0.7% at 650 nm, in contrast to the negligible IPCE values for pristine $TiO_2$ in the same region (FIG. 11a, inset). Although the IPCE values are much lower than that in the UV region, it is direct evidence for showing visible light photoresponse of $H:TiO_2$ nanowires as a result of hydrogen treatment. These results confirm that the enhanced photocurrent in $H:TiO_2$ nanowires is mainly attributed to the improved IPCE in the UV region, while the newly developed visible light absorption also made a small contribution.

The STH efficiency of $H:TiO_2$ nanowires were calculated by integrating their IPCE spectra with a standard AM 1.5G solar spectrum (ASTM G-173-03), using the equation $$\eta\% = \int_{300}^{650} \frac{1}{1240} \lambda (1.23 - V_{bias}) IPCE(\lambda) E(\lambda)$$

where E(λ) is the solar irradiance at a specific wavelength (λ), $V_{bias}$ is applied bias vs RHE, and IPCE is the obtained photoresponse profile of $H:TiO_2$ nanowire sample at a specific wavelength (λ) at −0.6 V vs Ag/AgCl. FIG. 11b shows the simulated STH conversion efficiencies as a function of wavelength in the range from 300 to 650 nm. The pristine $TiO_2$ and $H:TiO_2$ nanowire samples prepared at 350, 400, and 450° C. achieve the optimal STH efficiencies of ~0.1%, 1.1%, 0.89%, and 0.68% at ~0.6 V vs Ag/AgCl, respectively. Between 420 and 650 nm, there are very slight increases in efficiencies for the H:TiO$_2$ nanowire samples due to the relatively weak photoresponse in the visible region. The calculated STH conversion efficiencies are slightly lower than the values (1.63% for the H:TiO$_2$ nanowires annealed at 350° C.) obtained from the measured photocurrent density at the same potential, due to the discrepancy between the irradiance spectrum and the standard solar spectrum. Significantly, the optimal conversion efficiency of 1.1% is still the best value for TiO$_2$ materials under the standard AM 1.5G solar light illumination.

Figure 12:
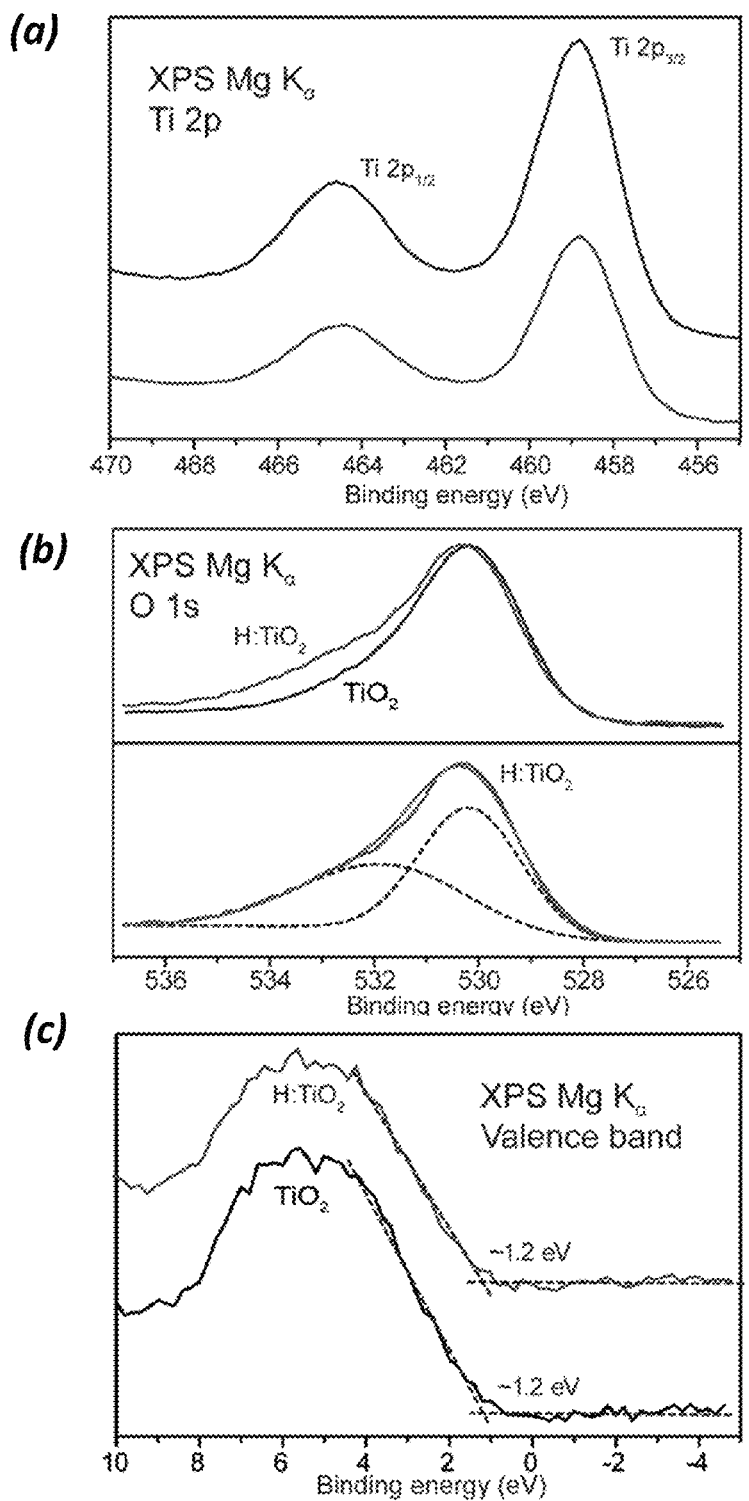
FIGS. 12a-12c. show (a) Ti 2p XPS spectra of the pristine TiO$_2$ nanowires and the H:TiO$_2$ nanowires annealed at 450° C. (b) (upper) Normalized O 1s XPS spectra of the pristine TiO$_2$ and the H:TiO$_2$ nanowires. (lower) The curve is the experimental result that deconvoluted into two peaks 530.2 and 532.0 eV (dashed curves). The upper curve is the summation of the two deconvoluted peaks. (c) XPS valence band spectra of the pristine TiO$_2$ and the H:TiO$_2$ nanowires. Dashed lines highlight the linear extrapolation of the curves, deriving a band edge position of −1.2 eV, according to embodiments of the invention.

In order to elucidate the effect of hydrogen treatment in enhancing the photoactivity in both the UV and visible regions, X-ray photoelectron spectroscopy (XPS) and electrochemical impedance measurements were also carried out. Specifically, XPS was performed to investigate the change of surface bonding of TiO$_2$ nanowires induced by hydrogen treatment, as well as the electronic valence band position of H:TiO$_2$ nanowires. XPS survey spectra collected from pristine TiO$_2$ (white) and H:TiO$_2$ (black) nanowire arrays treated at 450 !C are very similar. In addition to the Ti and O peaks that are expected for TiO$_2$, carbon signals were observed in both samples, believed to be included during sample preparation and subsequent handling. It proves that hydrogen treatment is a clean process that does not introduce impurities into the TiO$_2$ structure and, more importantly, the H:TiO$_2$ nanowires are not doped with other elements. FIGS. 12a and 12b show the high-resolution Ti 2p and O 1s spectra of the TiO$_2$ and H:TiO$_2$ nanowires. Their Ti 2p XPS spectra are identical with Ti 2p$_{3/2}$ and 2p$_{1/2}$ peaks centered at binding energies of 458.8 and 464.6 eV, which are consistent with the typical values for TiO$_2$. The H:TiO$_2$ nanowires exhibit a broader O 1s peak (530.4 eV) with an additional shoulder at higher binding energy, compared to the pristine TiO$_2$ nanowires. This broad peak can be deconvoluted into two peaks centered at 530.2 and 532.0 eV. The 532.0 peak is attributed to Ti—OH, which has been reported to be located at ~1.5-1.8 eV higher binding energy corresponding to the O 1s of TiO$_2$. The data confirm the formation of hydroxyl group on TiO$_2$ surface after hydrogen treatment. It was observed that the similar O 1s peak broadening and identical Ti 2p peaks in all H:TiO$_2$ nanowire samples prepared at different hydrogen annealing temperatures.

Finally, the valence band spectra of both the TiO$_2$ and H:TiO$_2$ nanowires were measured to investigate the effect hydrogen treatment on the electronic band structure of TiO$_2$ (FIG. 12c). For the hydrogenated TiO$_2$ nanoparticles reported in literature, the black color was attributed to a substantial shift (2.18 eV) of valence band position, as a result of surface disorder. Surprisingly, the work by the inventors revealed that the valence band spectra of TiO$_2$ and H:TiO$_2$ nanowires are very similar. Their valence band maxima are estimated by linear extrapolation of the peaks to the baselines, which derives a band edge position of ~1.2 eV below the Fermi energy in both cases. In fact, H:TiO$_2$ nanowires annealed at different temperatures exhibit almost the same valence band maximum, which confirms hydrogen treatment has a negligible effect on the valence band position at the TiO$_2$ nanowire surface.

Figure 13:
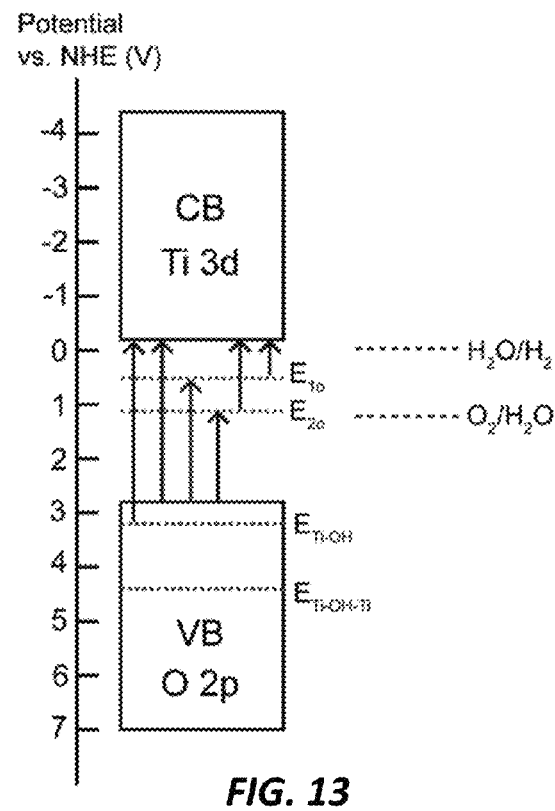
FIG. 13. Show an energy diagram of H:TiO$_2$ nanowires. $E_{1o}$ and $E_{2o}$ are referred to the oxygen vacancies located at 0.73 and 1.18 eV below the TiO$_2$ conduction band; $E_{Ti-OH}$ and $E_{Ti-OHTi}$ located at 0.7 and 2.6 eV below the TiO$_2$ valence band represent the energy levels of surface hydroxyl group. Further indicated are the $H_2O/H_2$ and $O_2/H_2O$ potentials. Arrows highlight the possible electronic transitions between the different energy levels in H:TiO$_2$, according to embodiments of the invention.

Given that there is no shift of the valence band edge, the dark color of H:TiO$_2$ nanowires is attributed to the formation of impurity/defect states in the band gap of TiO$_2$ during hydrogen treatment. XPS data confirmed that the H:TiO$_2$ samples are not doped with other elements, so the possible defect states are attributed to the formation of oxygen vacancies and surface hydroxyl groups on TiO$_2$. The O 2p energy levels for Ti—OH—Ti and Ti—OH were reported to be located at 2.6 and 0.7 eV below the valence band of rutile TiO$_2$, respectively. It has been reported that these states are energetically stable and cannot be oxidized by the valence band holes via electron transfer. This is supported by the high stability of H:TiO$_2$ nanowire photoanodes. The presence of these Ti—OH energy states below the valence band of TiO$_2$ should not lead to visible light absorption. The oxygen vacancies in the TiO$_2$ structure created during hydrogenation play a critical role in the visible light absorption and thereby the dark color of TiO$_2$. Energy levels of oxygen vacancies have been reported to be about 0.75 and 1.18 eV below the conduction band of hydrogen reduced rutile TiO$_2$ single crystal plates. A simplified energy diagram of H:TiO$_2$ nanowires ((referenced to normal hydrogen electrode (NHE)) is constructed based on the XPS valence band spectrum as well as the reported rutile TiO$_2$ band gap and the energy levels of oxygen vacancies and surface hydroxyl group (FIG. 13). The strong UV absorption of TiO$_2$ is due to the electronic transition from the valence band to the conduction band. High-temperature hydrogen treatment creates oxygen vacancies in the band gap of TiO$_2$ nanowires. The visible and near-IR light absorption can be attributed to the transitions from the TiO$_2$ valence band to the oxygen vacancy levels or from the oxygen vacancies to the TiO$_2$ conduction band. However, the photoexcited electrons located at oxygen vacancies are not involved in water splitting because their energy levels are well below the H$_2$O/H$_2$ reduction potential. Additionally, the electronic transition between the localized oxygen vacancy states and the delocalized conduction band is not expected to be significant because the coupling between the localized and the delocalized energy states should be weak. It explains the observation of weak photoactivity in the visible region for H:TiO$_2$ nanowires and the negligible contribution to the photocurrent (FIG. 11a, inset).

Figure 14:
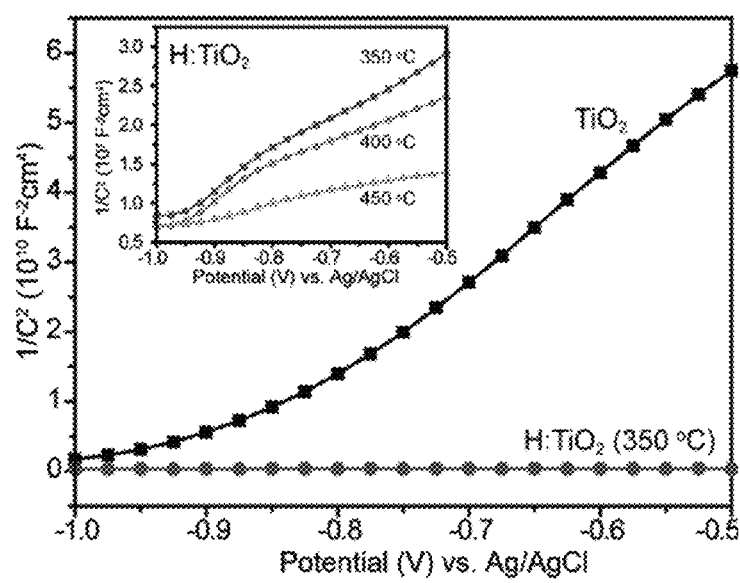
FIG. 14. Shows Mott-Schottky plots collected at a frequency of 5 kHz in the dark for the pristine TiO$_2$ and the H:TiO$_2$ nanowires annealed at 350° C. Inset: Mott-Schottky plots of H:TiO$_2$ nanowires prepared at 350, 400, and 450° C., collected under the same conditions, according to embodiments of the invention.

Additionally, electrochemical impedance measurements were conducted on the pristine TiO$_2$ and H:TiO$_2$ nanowire sample annealed at 350° C. at a frequency of 5 kHz in the dark, to investigate the influence of hydrogen treatment on the TiO$_2$ electronic properties. All TiO$_2$ nanowire samples show a positive slope in the Mott-Schottky plots, as expected for n-type semiconductor (FIG. 14). Importantly, the H:TiO$_2$ nanowire samples show substantially smaller slopes of Mott-Schottky plot compared to the TiO$_2$ sample, suggesting an increase of donor densities. The donor density increases with the hydrogen treatment temperature (FIG. 14, inset). Carrier densities of these nanowires were calculated from the slopes of Mott-Schottky plots using the equation $$N_d = (2/e_0 \varepsilon \varepsilon_0)[d(1/C^2)/dV]^{-1} \quad (2)$$

where $e_0$ is the electron charge, E the dielectric constant of TiO$_2$ ($\varepsilon$=170), $\varepsilon_0$ the permittivity of vacuum, $N_d$ the donor density, and V the applied bias at the electrode. The calculated electron densities of the pristine TiO$_2$ and H:TiO$_2$ (350° C.) nanowires were 5.3×10$^{18}$ and 2.1×10$^{22}$ cm$^{-3}$, respectively. Although the fact that Mott-Schttoky is derived from a flat electrode model and may have errors in determining the absolute value of donor density, hydrogen treatment leads to a significant enhancement of carrier density in TiO$_2$ is evident through a qualitative comparison of the slopes of the Mott-Schottky plots, given that there is no obvious change of nanowire morphology after hydrogenation.

The enhanced donor density is due to the increased oxygen vacancies, which are known to be an electron donor for TiO$_2$. The increased donor density improves the charge transport in TiO$_2$, as well as the electron transfer at the interface between the semiconductor and the FTO substrate. Moreover, the increased electron density is expected to shift the Fermi level of $TiO_2$ toward the conduction band. The upward shift of the Fermi level facilitates the charge separation at the semiconductor/electrolyte interface, by increasing the degree of band bending at the $TiO_2$ surface. The enhanced charge separation and transportation are believed to be the major reasons for the observed IPCE enhancement in the UV region.

Figure 15:
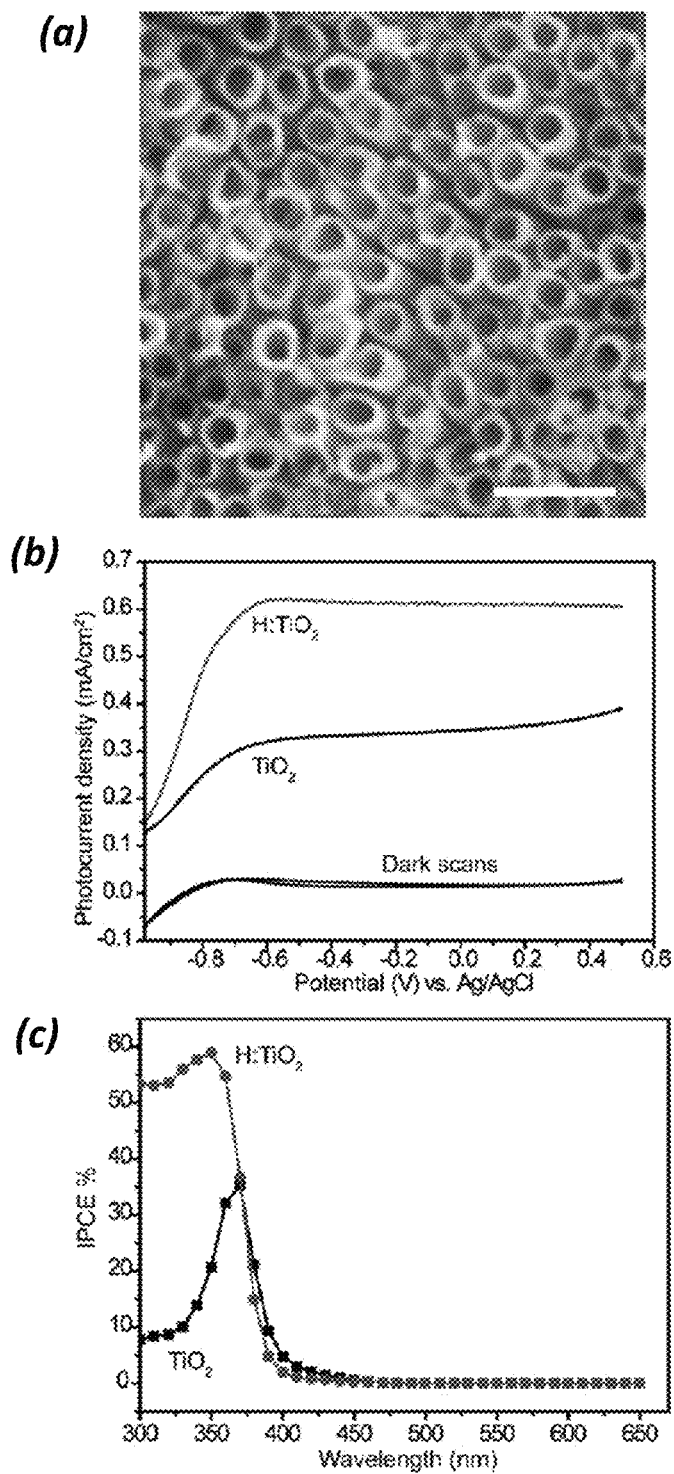
FIGS. 15a-15c shows (a) SEM image of TiO$_2$ nanotube arrays prepared by electrochemical anodization. Scale bar is 600 nm. (b) Linear sweeps collected for the pristine TiO$_2$ and the H:TiO$_2$ nanotube arrays annealed in hydrogen at 400° C., in a 1 M NaOH electrolyte solution with a scan rate of 50 mV/s under AM 1.5G 100 mW/cm$^2$ illumination. (c) IPCE spectra of the pristine TiO$_2$ and the H:TiO$_2$ nanotubes collected at −0.6 V vs Ag/AgCl, according to embodiments of the invention.

Finally, to confirm the hydrogen treatment is a general strategy for enhancing the performance of $TiO_2$ for water splitting, PEC studies were conducted on the pristine and hydrogen-treated anatase $TiO_2$ nanotubes. The uniform $TiO_2$ nanotube arrays with tube diameter of 150 nm were fabricated by a reported electrochemical anodization method (FIG. 15a). XRD data confirm the nanotube arrays are anatase phase $TiO_2$ and there is no phase change after hydrogenation at 350 and 450° C. Significantly, it was observed that a 2-fold enhanced photocurrent density for $TiO_2$ nanotubes after hydrogen treatment, as it has demonstrated for the rutile $H:TiO_2$ nanowires. IPCE measurements also confirm that the enhanced photocurrent of $H:TiO_2$ nanotubes is due to the improved photoactivity in the UV region. The weak photoactivity of pristine anatase $TiO_2$ nanotube in the 400-420 nm is believed due to the fluorine doping that unintentionally incorporated during anodization synthesis in NH4F.

Turning now to hydrogen-treated $WO_3$, according to one embodiment of the invention. Here, the invention provides photostability and photoactivity of $WO_3$ for water oxidation that can be simultaneously enhanced by controlled introduction of oxygen vacancies into $WO_3$ in hydrogen atmosphere at elevated temperatures. In comparison to pristine $WO_3$, the hydrogen-treated $WO_3$ nanoflakes show an order of magnitude enhanced photocurrent, and more importantly, exhibit extraordinary stability for water oxidation without loss of photoactivity for at least seven hours. The enhanced photostability is attributed to the formation of substoichiometric $WO_{3-x}$ after hydrogen treatment, which is highly resistive to the re-oxidation and peroxo-species induced dissolution.

Similar to the hydrogen-treated $TiO_2$ nanowires described above, a similar effect is observed in hydrogen-treated $WO_3$. More importantly, it has been reported that substoichiometric $WO_{3-x}$, formed by creating oxygen vacancies ($W^{5+}$) in $WO_3$, is thermodynamically stable at room temperature, and can only be re-oxidized in air at a temperature higher than 400° C. For instance, substoichiometric $WO_{3-x}$ has been used as a passive layer to protect tungsten metal from further dissolution in chemical mechanical polishing, indicating $WO_{3-x}$ is resistive to the peroxo-species induced dissolution.

Therefore, hydrogen treatment can create substoichiometric $WO_{3-x}$, which could simultaneously improve the photoactivity and stability of $WO_3$ for water oxidation. According to one embodiment of the current invention, substoichiometric $WO_{3-x}$ is provided by controlled introduction of oxygen vacancies (reducing $W^{6+}$ to $W^{5+}$) in hydrogen atmosphere at elevated temperatures. In comparison to pristine $WO_3$, hydrogen-treated $WO_{3-x}$ showed an order of magnitude enhanced photocurrent density and extraordinary stability without significant loss of photoactivity for at least seven hours.

Figure 16:
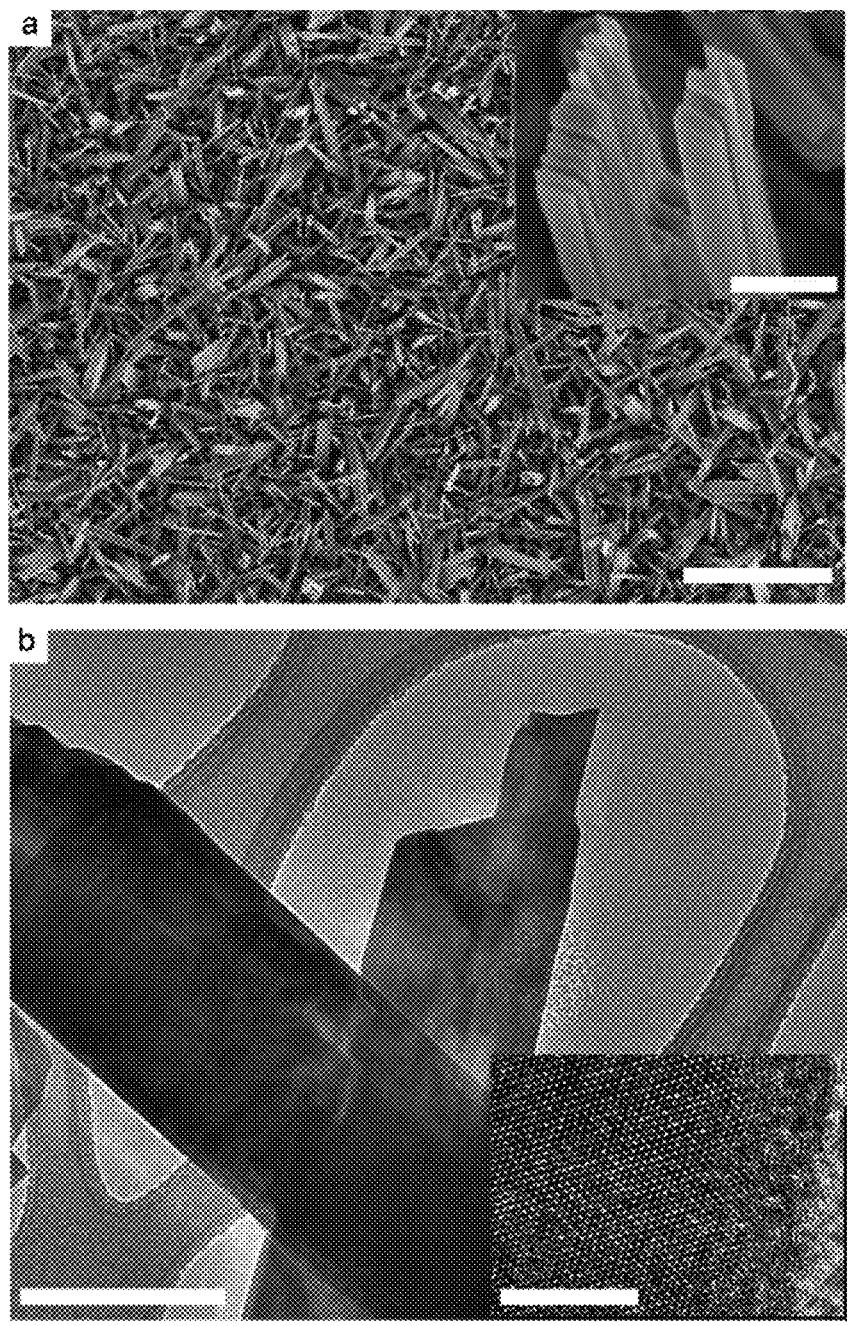
FIGS. 16a-16b show (a) SEM image of WO3 nanoflakes (scale bar: 10 mm); inset: magnified SEM image of nanoflake bundles (scale bar: 1 mm). (b) TEM images of WO$_3$ nanoflakes (scale bar: 100 nm); inset: lattice-resolved TEM image collected at the edge of the nanoflake (scale bar: 5 nm), according to embodiments of the invention.

Hydrogen treatment was carried out in a tube furnace system. The calcined $WO_3$ nanoflake films were further annealed in hydrogen (1 bar, 50 sccm $H_2$ flow) at different temperatures in the range of 250-500° C. for 20 minutes. $WO_3$ nanoflake films were fabricated on fluorine-doped tin oxide (FTO) substrates, using a seed mediated solvothermal method. The uniform $WO_3$ films are covered by submicron-sized nanoflake bundles with a typical length of 4-5 mm (FIG. 16a). Each bundle is composed of a stack of thin nanoflakes. TEM images recorded from representative $WO_3$ nanoflake bundles showed that these nanoflakes are single crystals (inset, FIG. 1b) with a smooth surface (FIG. 16b).

The as-prepared nanoflakes were first calcined in air at 500 $C for 2 h, followed by high temperature annealing (250-500° C.) in hydrogen atmosphere for another 20 minutes to create oxygen vacancies in $WO_3$. The pristine $WO_3$ film is yellow in color. As the hydrogen annealing temperature increases, the film color changes from green (350° C.) to deep green (400° C.) and eventually to dark blue when the temperature is 450° C. or above. FIG. 16a shows the UV-visible diffusive reflectance spectra of $WO_3$ and H-treated $WO_3$ samples prepared at 350, 400 and 450° C. All the samples show fairly low reflectance in the UV and blue region (<400 nm). The reflectance increases and peaks at around 480 nm, which is consistent with the indirect bandgap absorption edge of $WO_3$ (2.6 eV). The low reflectance in the red region is due to low scattering and lack of absorption, while the low reflectance in the UV region is mostly due to absorption of the sample, which dominates over scattering.

$WO_3$ samples absorb most of the UV-blue light and therefore appear yellow in color. For the hydrogen-treated samples, the reflectance in the wavelength above 480 nm decreases significantly (absorb more orange and red light) as the temperature increases, which is in agreement with the color changes from yellow to blue. The color change suggests possible modification in crystal structure and/or phase change during hydrogen treatment. XRD spectra collected from pristine $WO_3$ and hydrogen-treated $WO_3$ samples prepared at 350 and 500° C. (FIG. 16b) confirmed this hypothesis. After subtracting the diffraction peaks originating from the FTO substrate, the peaks collected from pristine $WO_3$ can be indexed as monoclinic $WO_3$ (PCPDF #: 72-1465). There is no obvious shift in the diffraction peaks between pristine $WO_3$ and the hydrogen-treated $WO_3$ samples at 350° C. However, these monoclinic $WO_3$ diffraction peaks gradually disappear accompanied with the emergence of new peaks in the samples hydrogen treated at the temperature of 500 $_s$C. These new peaks can be indexed as monoclinic $WO_{2.9}$ (PCPDF #: 05-0386) and small amount of monoclinic $WO_{2.92}$ (PCPDF #: 30-1387) highlighted by * and + in FIG. 16b, indicating the successful reduction of $WO_3$. Diffraction peaks corresponding to Sn metal are also identified as a result of the reduction of the FTO substrate. Furthermore, Raman analysis also confirms the conversion of monoclinic $WO_3$ to $WO_{2.9}$ during hydrogen treatment (FIG. 16c). The characteristic Raman peaks for $WO_3$ become broader as the annealing temperature increases, suggesting gradual degradation of $WO_3$ crystallinity, which is expected for the increased amount of oxygen vacancies. For the $WO_3$ sample hydrogen-treated at 500° C., all the Raman peaks of $WO_3$ disappeared, and left a broad peak in the region of 700-1000 cm$^{-1}$, which is consistent with the reported Raman spectrum of $WO_{2.9}$. Additionally, the formation of $W^{5+}$ allows the intervalence charge transfer between $W^{5+}$ to $W^{6+}$ in the substoichiometric $WO_{3-x}$, which explains the observed color change gradually from yellow ($WO_3$) to deep blue ($WO_{2.9}$ and $WO_{2.92}$). Taken together, these results support the successful introduction of oxygen vacancies into monoclinic $WO_3$ by hydrogen treatment, and the amount of oxygen vacancies can be controlled by the annealing temperature.

Figure 17:
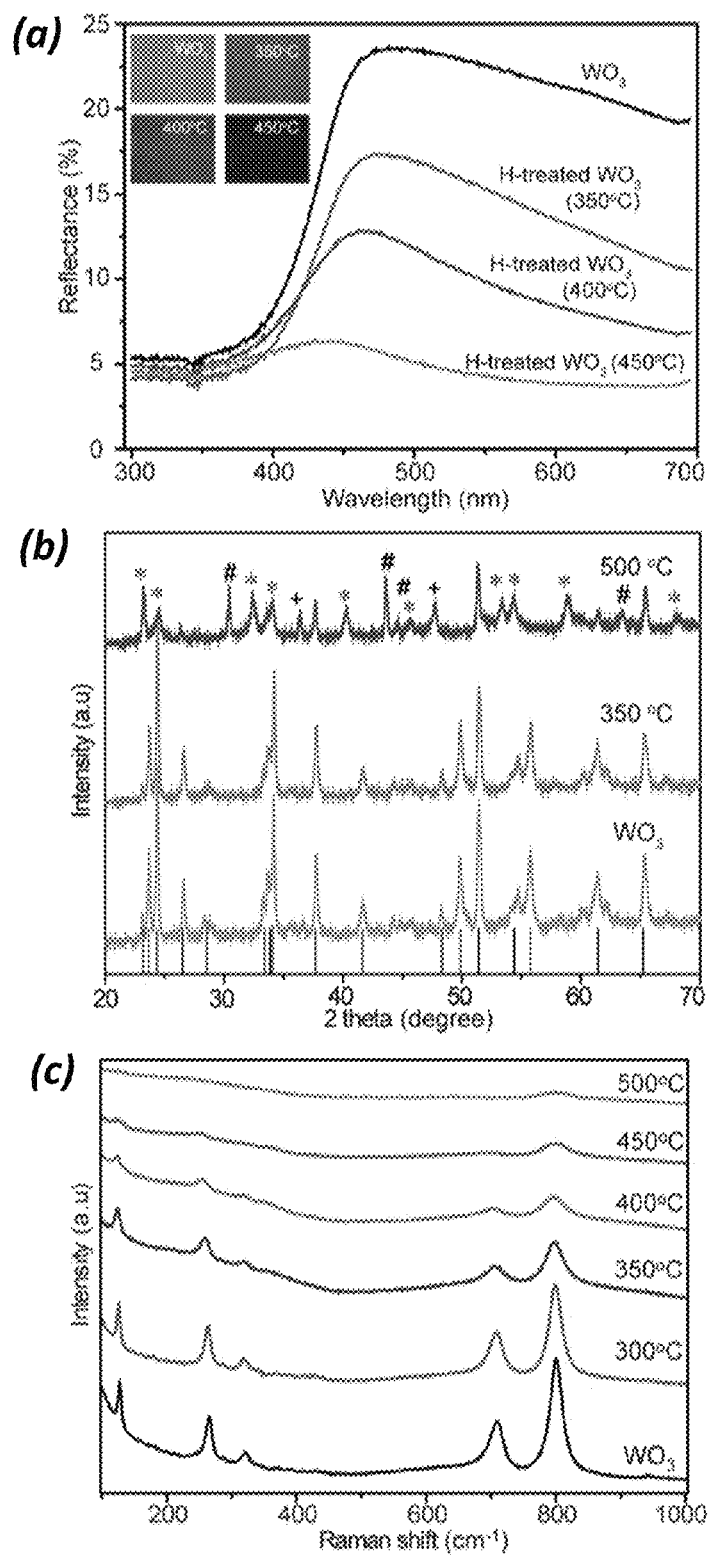
FIGS. 17a-17c show (a) UV-visible diffusive reflectance spectra of pristine WO$_3$ and WO$_3$ samples annealed in hydrogen at temperatures of 350, 400, and 450° C. Insets are digital pictures of these samples. (b) XRD spectra of pristine WO$_3$ and hydrogen-treated WO$_3$ samples prepared at 350 and 500° C. The diffraction peaks of WO$_3$, FTO, WO$_{2.9}$, WO$_{2.92}$ and Sn metal. (c) Raman spectra of WO$_3$ and hydrogen treated WO$_3$ prepared at various temperatures, according to embodiments of the invention.

The PEC properties of pristine $WO_3$ and hydrogen-treated $WO_3$ samples were measured in a three-electrode electrochemical cell (using Ag/AgCl in sat. KCl as reference electrode and Pt wire as counter electrode) with 0.5 M $Na_2SO_4$ solution as electrolyte. FIG. 17a compares the linear sweep voltammograms collected for pristine $WO_3$ and hydrogen-treated $WO_3$ samples at temperatures of 350, 400 and 450° C.

The photocurrent density of pristine $WO_3$ sample is 0.1 mA $cm^{-1-2}$ at 1.0V vs. Ag/AgCl, which is comparable to the value obtained for the $WO_3$ nanowire photoanode in literature. The photocurrent densities of $WO_3$ increase gradually with the increase of hydrogen treatment temperature from 250 to 350° C. (FIG. 17b).

The $WO_3$ sample hydrogen treated at 350° C. achieved a maximum value of 0.88 mA $cm^{-2}$ at 1.0 V vs. Ag/AgCl, which is about an order of magnitude enhancement compared to pristine $WO_3$ at the same potential. The enhancement is believed to be due to the increased amount of oxygen vacancies that serve as shallow electron donor for $WO_3$. It confirms our hypothesis that hydrogen treatment could improve the photoactivity of $WO_3$. Photocurrent densities decrease gradually with increasing temperature when the annealing temperature is 400° C. or above. There are two possible explanations. First, $WO_3$ transforms into $WO_{2.9}$ during hydrogen treatment (as confirmed by XRD and Raman results), and $WO_{2.9}$ is known to be photoelectrochemically inactive for water oxidation. Second, the resistance of the FTO substrate increased from 13 to 760Ω as a result of degradation of the FTO layer (Sn metal formation as confirmed by XRD results), which increases the voltage drop at the interface of $WO_3$ and the substrate.

Figure 18:
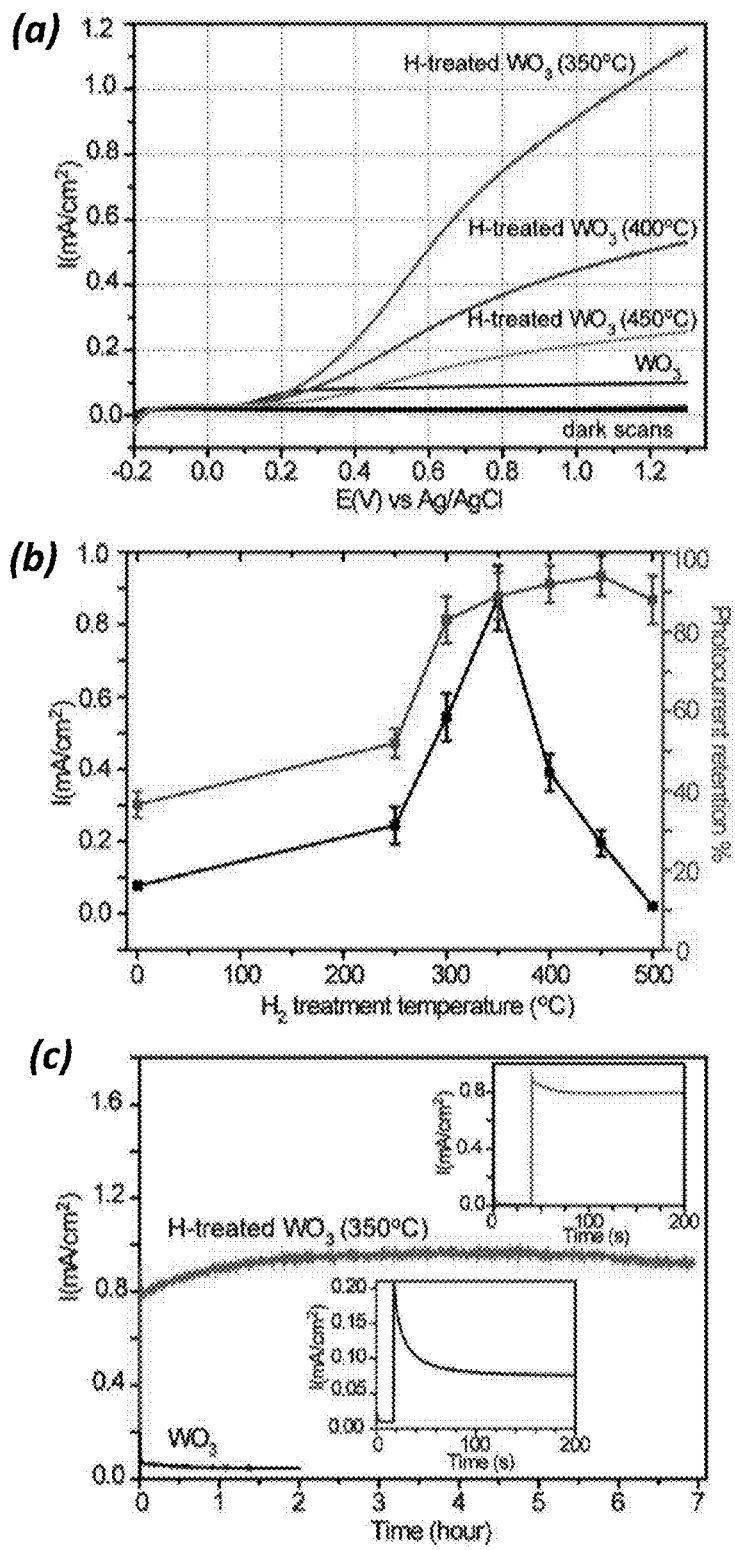
FIGS. 18a-18c show measured PEC properties for WO$_3$ and hydrogen-treated WO$_3$ samples. (a) Representative I-V curves measured under 100 mW cm$^{-2}$ simulated solar light generated by a 100 W xenon lamp coupled with an AM 1.5G filter. (b) Photocurrent densities and photocurrent density retention measured at 1.0 V vs. Ag/AgCl for the first 6 minutes of irradiation as a function of hydrogen annealing temperatures. (c) I-t curves collected at 1.0 V vs. Ag/AgCl; insets: I-t curves for the first 200 seconds of irradiation, according to embodiments of the invention.
Figure 19:
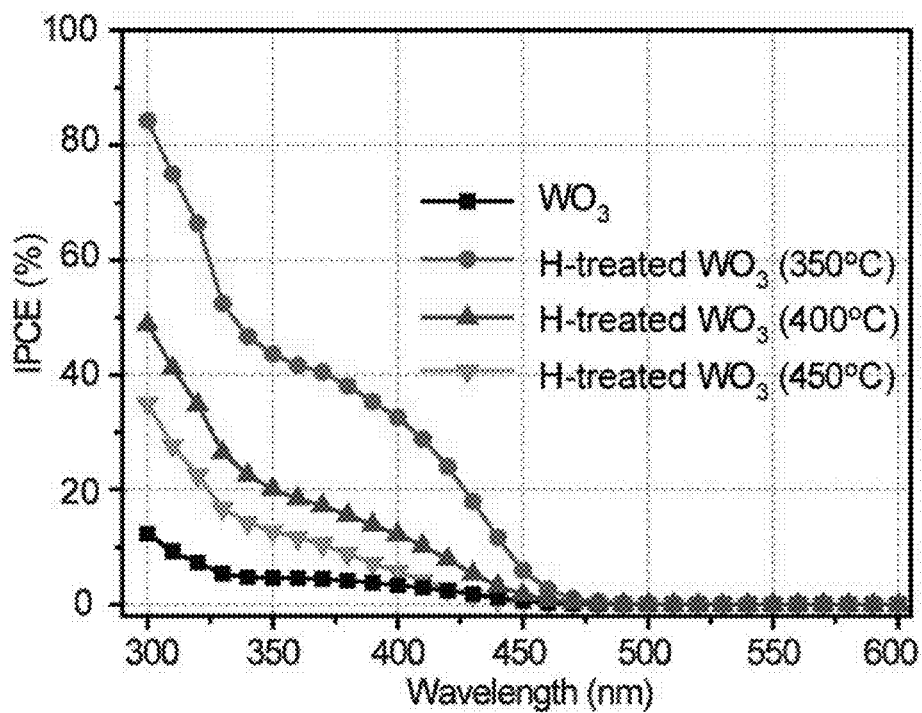
FIG. 19 show IPCE spectra measured at 1.0 V vs. Ag/AgCl with a 1000 W xenon lamp coupled with a monochromator at the incident wavelength range from 300 to 600 nm, according to embodiments of the invention.

To investigate the stability of pristine $WO_3$ and hydrogen-treated $WO_3$ for water oxidation, a parameter of photocurrent density retention is defined in the first six minutes of irradiation as $I_{initial}/I_{final}$, where $I_{initial}$ and $I_{final}$ are the photocurrent densities at time=0 and 6 min, respectively. All the samples for the stability investigation are freshly prepared. As shown in FIG. 18b, photocurrent density retention for pristine $WO_3$ is only about 30%, which is comparable to the reported values for $WO_3$ nanostructures. Significantly, the retention values of hydrogen-treated $WO_3$ samples increase substantially with annealing temperature, achieving excellent photocurrent density retention more than 80% for those samples annealed at 350° C. or above. Furthermore, the long-term stability of these samples (FIG. 18c) were investigated. The photocurrent density of $WO_3$ drops about 65% within the first two minutes, and then decreases slowly (FIG. 18c, inset). After a two-hour illumination, 80% of the photoactivity of $WO_3$ was lost. In contrast, the photocurrent density for the hydrogen-treated $WO_3$ sample prepared at 350° C. drops 17% within the first 2 minutes, and then achieves a stable photocurrent without decay under the irradiation for at least seven hours (FIG. 18c). That the photocurrent increases slightly with time could be due to self-activation and increasing trap filling of the $WO_{3-x}$ sample. These I-t data are direct evidence show that hydrogen treatment can stabilize the photoactivity of $WO_3$ for water oxidation, according to the current invention. The superior stability of hydrogen-treated $WO_3$ for water oxidation is believed to be due to the formation of partially reduced substoichiometric $WO_{3-x}$, which has been reported to be thermodynamically stable at room temperature towards re-oxidation and highly resistive to peroxide species induced dissolution. The color changes of $WO_3$ during hydrogen treatment suggest a modification in the light absorption profile. In order to quantitatively investigate the relation between the photoactivity and the light absorption, their photoactivity as a function of the wavelength of incident light was measured. FIG. 19 shows the IPCE data collected from $WO_3$ and hydrogen-treated $WO_3$ samples with green (350° C.), blue (400° C.) and deep blue (450° C.) colors. IPCE can be expressed by the equation:

$$IPCE = (1240 \times I)/(\lambda \times J_{light}), \quad (3)$$

where I is the measured photocurrent density at a specific wavelength, l is the wavelength of incident light, and $J_{light}$ is the measured irradiance at a specific wavelength. In comparison to pristine $WO_3$, all hydrogen-treated $WO_3$ samples exhibit enhanced IPCE in the entire absorption region (300-480 nm). They show similar absorption edges at around ~480 nm, which is consistent with the $WO_3$ bandgap of 2.6 eV. There were no observations of any photoactivity in the visible light region beyond 480 nm, indicating that the observed color change is not due to the bandgap engineering of $WO_3$ or the transition between the impurity states and conduction/valence band edges. Therefore, the color changes could be due to intervalence charge transition from $W^{6+}$ to $W^{5+}$, which have previously been reported.

Figure 20:
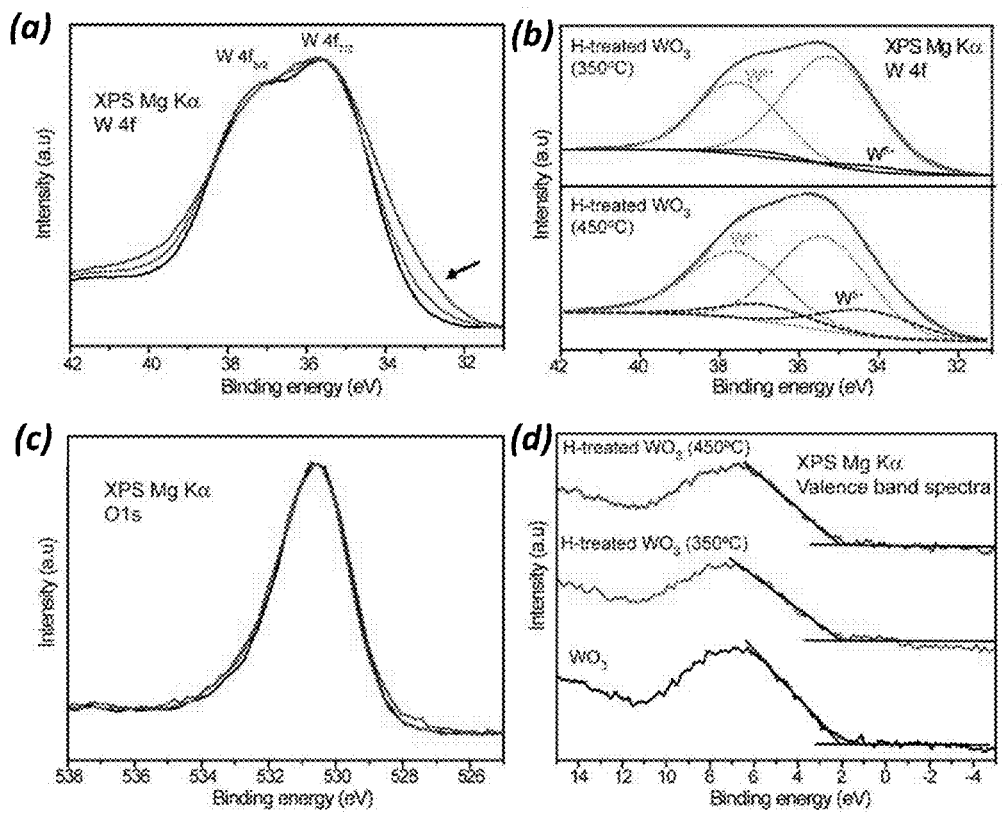
FIGS. 20a-20d show (a) Normalized W 4f XPS spectra of $WO_3$ and hydrogen-treated $WO_3$ samples prepared at 350° C. and 450° C. The arrow highlights the shoulder developed in the hydrogentreated $WO_3$ samples. (b) High-resolution W4f XPS spectra of hydrogentreated $WO_3$ samples prepared at 350° C. (upper) and 450° C. (lower). (c) Normalized O 1s XPS spectra collected for $WO_3$ (black line) and hydrogen-treated $WO_3$ prepared at temperatures of 350° C. and 450° C. (d) XPS valence band spectra collected for $WO_3$ and hydrogen-treated $WO_3$ prepared at temperatures of 350° C. and 450° C., according to embodiments of the invention.

To further elucidate the effect of hydrogen treatment on the chemical states of $WO_3$ and how it interplays with their photoactivity, measurements were made of the X-ray photoelectron spectroscopy (XPS) of pristine $WO_3$ and hydrogen-treated $WO_3$ samples prepared at temperatures of 350° C. and 450° C. XPS survey spectra collected from $WO_3$ and hydrogen-treated $WO_3$ samples confirm the presence of W and O as well as a small amount of C, while no other impurities' signal was found in the samples. Carbon is believed to be included during sample preparation (in air) and subsequent handling. As shown in the normalized high resolution W 4f spectra (FIG. 20a and FIG. 20b), they all have a broad peak, corresponding to the characteristic W $4f_{5/2}$ and W $4f_{7/2}$ peaks for $WO_3$. The XPS W 4f of pristine $WO_3$ can be deconvoluted into one pair of peaks, corresponding to the typical binding energies of $W^{6+}$ oxidation states (centered at 37.7 and 35.5 eV). Note that the W 4f peaks of hydrogen-treated samples are slightly broader than that of pristine $WO_3$, with a shoulder at the lower binding energy region (FIG. 20a). The peak can be deconvoluted into two pairs of peaks, corresponding to the typical binding energies of two W oxidation states, $W^{6+}$ (centered at 37.7 and 35.5 eV) and $W^{5+}$ (centered at 37.0 and 34.3 eV) respectively (FIG. 20b).

Figure 21:
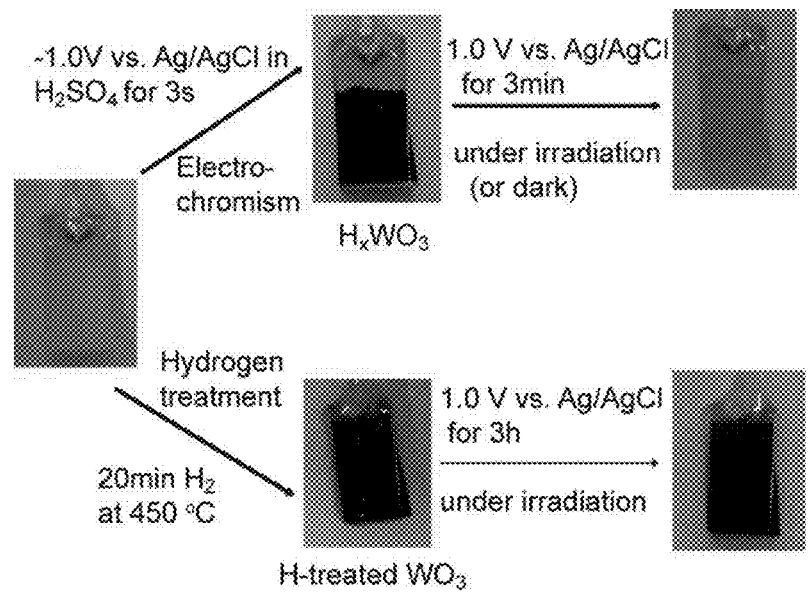
FIG. 21 shows a comparative study of the electrochemical and photoelectrochemical stability of the $H_xWO_3$ sample and the hydrogen-treated $WO_3$ sample, according to embodiments of the invention.

The data suggest the presence of $W^{5+}$ (oxygen vacancies) in the hydrogen-treated $WO_3$ samples, in agreement with the Raman and XRD results. The amount of $W^{5+}$ is estimated to be 4% in the H-treated $WO_3$ sample prepared at 350° C., and it increased to 20% in the sample prepared at 450° C. The results support that the $W^{5+}$ increased with the increase of annealing temperature. It is known that the substoichiometric $WO_{3-x}$ is favorable to form shear defects. The normalized XPS O1s spectra collected from $WO_3$ and hydrogentreated $WO_{3-x}$ samples are similar (FIG. 20c), indicating that these plane defects do not significantly affect the coordination polyhedron of oxygen about each W. In addition, the absence of the hydroxyl (O—H) peak or broader shoulder that is expected to be observed at around 532 eV indicates that the hydrogen treatment did not lead to the formation of tungsten bronze $H_xWO_3$, which is also blue in color. $H_xWO_3$ is well known for its electrochromism, as it can be easily bleached by applying a positive bias. To differentiate $WO_{3-x}$ from $H_xWO_3$, the PEC water oxidation stability of the hydrogen-treated $WO_3$ and $H_xWO_3$ control samples were studied. $H_xWO_3$ was electrochemically prepared on pristine $WO_3$. The performance of $H_xWO_3$ and hydrogen-treated $WO_3$ were compared for water oxidation at a bias of 1.0 V vs. Ag/AgCl in 0.5 M $Na_2SO_4$ solution. As shown in FIG. 21, $H_xWO_3$ was quickly bleached due to its electrochromatic property within 3 minutes either in the dark or under illumination, as expected. In contrast, there is no obvious change in color and photoactivity for the hydrogen-treated $WO_3$ sample measured at the same potential under light illumination for 3 hours. This proves that the hydrogen-treated samples are not $H_xWO_3$ and they are stable and resistive to electrochemical oxidation.

Finally, the XPS valence band spectra collected from $WO_3$ and $WO_{3-x}$ samples are similar and an estimate of the valence band maximum by linear extrapolation to the baseline derives a band edge position of ~2.0 eV below the Fermi energy in both cases (FIG. 20d). The fact that all the films exhibit almost the same position of the valence band maximum indicates a negligible effect of hydrogen treatment on the valence band position at the surface of $WO_3$.

To investigate the effect of hydrogen treatment on the electronic properties of $WO_3$, the electrochemical impedance for pristine $WO_3$ and hydrogen-treated $WO_3$ samples were measured. Capacitances were derived from electrochemical impedance spectroscopy (EIS) obtained at each potential with 10 kHz frequency in the dark.

Figure 22:
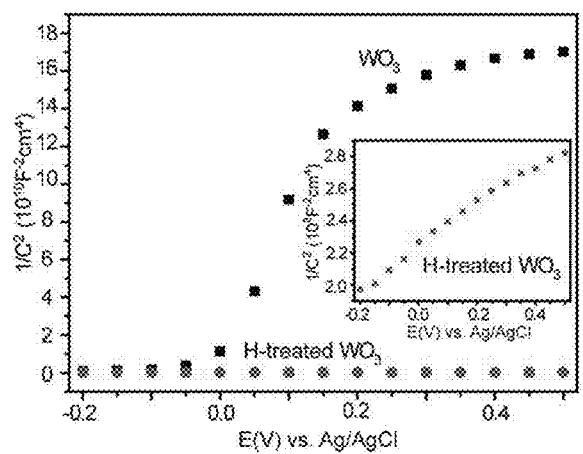
FIG. 22 show Mott-Schottky plots collected for $WO_3$ and hydrogen-treated $WO_3$ sample prepared at 350° C. with a frequency of 10 kHz in the dark, according to embodiments of the invention.

FIG. 22 shows the Mott-Schottky plots generated from the capacitance values. All samples show positive slopes in the Mott-Schottky plots, as expected for n-type semiconductors. The hydrogen-treated $WO_3$ samples show substantially smaller slopes compared to the $WO_3$ sample, suggesting significantly increased donor densities based on the Mott-Schottky equation, $$N_d = (2/e_0 \in \in_0)[d(1/C^2)/dV]^{-1} \quad (4)$$

where $e_0$ is the electron charge, E the dielectric constant of $WO_3$ ($\in=20$), $\in_0$ the permittivity of vacuum, $N_d$ the donor density, and V the applied bias at the electrode. The donor densities of $WO_3$ and hydrogen-treated $WO_3$ prepared at 350° C. are calculated to be $1.0 \times 10^{19}$ and $5.0 \times 10^{22}$ cm$^{-3}$, respectively. Although the Mott-Schottky equation is derived based on the planar structure and it may not be able to determine precisely the donor density of nanostructured materials, it is reasonable to qualitatively compare the changes of donor density between $WO_3$ and hydrogen-treated $WO_3$ samples as they have similar morphology. The enhanced donor density is attributed to the introduction of oxygen vacancies, which serve as shallow electron donor, and therefore improves the charge transport in $WO_{3-x}$ and at the interface between FTO and $WO_{3-x}$. Furthermore, the capacitance of pristine $WO_3$ reaches a plateau at around 0.2 V vs. Ag/AgCl, which suggests that the depletion layer does not increase with further increase of applied potential. It explains the photocurrent density saturation of $WO_3$ at around 0.2 V vs. Ag/AgCl (FIG. 18a). Meanwhile, photocurrent density saturation for hydrogen-treated $WO_3$ in the potential range studied was not observed, which is consistent with its linear Mott-Schottky plot. Furthermore, there is a negative shift of flat band potential in hydrogen-treated samples. It could be due to the substantially increased donor density that shifts the Fermi level of $WO_3$ upward. Additionally, the contribution of Helmholtz layer capacitance becomes significant when there is a three orders of magnitude increase in the donor density of $WO_3$, which will cause a negative shift of the flat band potential (x-intercept) in the Mott-Schottky plot as well. Also measured was the Mott-Schottky plots for $WO_3$ and hydrogen-treated $WO_3$ samples with applied frequencies of 1 kHz, 4 kHz, and 7 kHz (data not shown). As expected, the slopes of Mott-Schottky plots of these samples increase with the increase of applied frequency, because the dielectric constant is frequency dependent. Similar flat-band potentials were obtained from Mott-Schottky plots generated at different frequencies.

Turning now to hydrogenated ZnO nanorod arrays (NRAs), according to one embodiment of the invention. ZnO NRAs that were grown on F-doped $SnO_2$ (FTO) glass substrates yield a benchmark specific hydrogen production rate of 122 500 µmol h$^{-1}$ g$^{-1}$, and exhibit excellent stability and recyclability. Photocatalytic hydrogen evolution from water is a promising and environmentally friendly method to produce hydrogen.

According to one embodiment of the invention, the performances of metal oxide electrode materials for photoelectrochemical cells and supercapacitors can be enhanced through hydrogenation. Here, the growth of hydrogenated ZnO (denoted H:ZnO) NRAs on a solid substrate and their implementation as photocatalysts for hydrogen evolution. Nanorods with high aspect ratio offer not only a large accessible surface area for charge transfer and a short diffusion length for minority carriers, but also a long pathway for light absorption along the NR axis. The immobilization of NRs on a substrate prevents aggregation of ZnO active materials and eliminates the tedious separation and recovery processes for ZnO powder catalysts. Significantly, surface defects such as oxygen vacancies ($V_O$) and interstitial hydrogen ($H_i$) were introduced into ZnO via hydrogenation. These impurities can increase the carrier density of ZnO and facilitate the transport of photoexcited charge carriers. The current embodiment provides a new approach to enhance the photocatalytic performance and utilization of ZnO photocatalyst.

Figure 23:
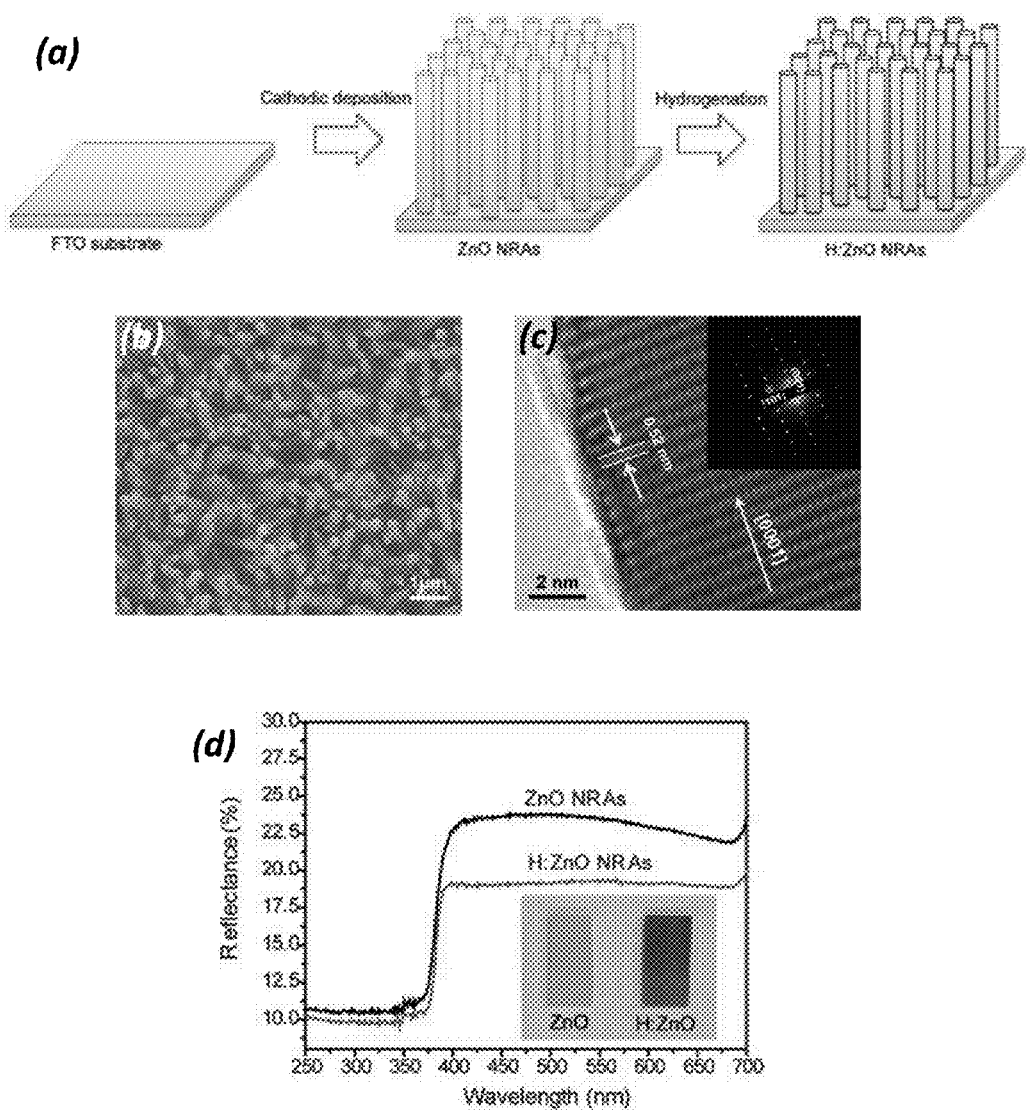
FIGS. 23a-23b show (a) A schematic diagram showing the fabrication of H:ZnO NRAs. (b) SEM image of H:ZnO NRAs. (c) Lattice-resolved TEM image collected at the edge of a H:ZnO NR. Inset: the diffraction pattern recorded from the H:ZnO NR. (d) Diffuse reflectance UV-visible spectra of ZnO and H: ZnO NRAs. Inset: picture of ZnO and H:ZnO NR films, according to embodiments of the invention.

Vertically aligned H:ZnO NRAs were grown on an FTO glass substrate by cathodic electrodeposition, followed by hydrogenation (FIG. 23a). The substrate was uniformly coated with a white film after electrodeposition. The as-prepared samples were annealed in air at 350° C. for 3 h, and then further annealed in a tube furnace system, filled with ultra-high purity hydrogen gas at 350° C. for 3 h. Scanning electron microscopy (SEM) studies reveal that the white film is composed of dense and vertically aligned NRs with an average diameter of ~200 nm and length of ~2 mm (FIG. 23b). The lattice-resolved transmission electron microscopy (TEM) image shows that the H:ZnO NR is a single crystal with lattice fringes of 0.52 nm parallel to its growth axis, corresponding to the (0001) plane of wurtzite ZnO. Selected area electron diffraction (SAED) analysis further confirms that ZnO NRs grow along the direction of [0001] (FIG. 23c). Furthermore, SEM and TEM images collected for ZnO NRs (air-annealed) show that they have the same morphology and growth direction as H:ZnO.

Figure 24:
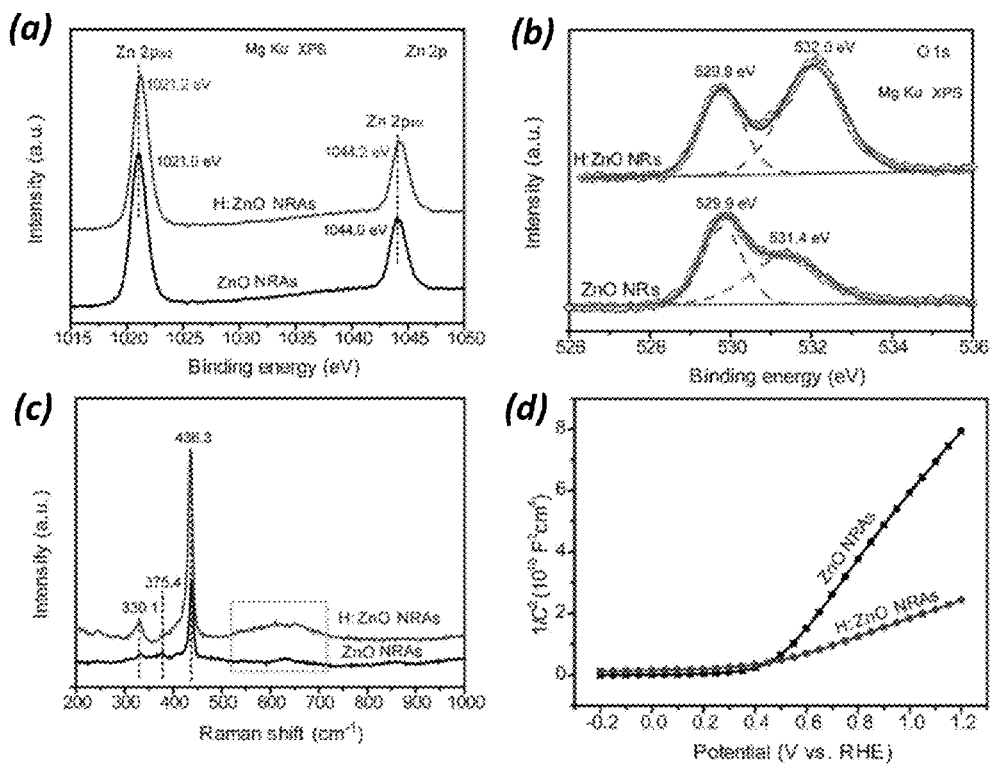
FIGS. 24a-24d show core level (a) Zn 2p and (b) O 1s XPS spectra of ZnO and H:ZnO NRAs. (c) Raman spectra of ZnO and H:ZnO NRAs. Dashed lines highlight the characteristic peaks for ZnO. (d) Mott-Schottky plots collected for ZnO and H:ZnO NRAs at a frequency of 10 kHz in the dark, according to embodiments of the invention.

X-ray diffraction (XRD) spectra collected from ZnO and H:ZnO NRs show that their diffraction peaks can be indexed to hexagonal wurtzite structure of ZnO. Note that the H:ZnO sample has broader diffraction peaks compared to ZnO. It suggests that the crystallinity of ZnO degrades after hydrogenation, which could be due to the formation of defects. Additionally, the white ZnO film changed to black after hydrogenation (FIG. 23d, inset). Diffuse reflectance UV-visible spectra were collected for ZnO and H:ZnO samples to study the influence of hydrogenation on the optical absorption of ZnO. As shown in FIG. 23d, both samples have fairly low reflectance in the UV region (<370 nm) and the reflectance increases rapidly at around 380 nm. This is consistent with the ZnO band-gap of 3.27 eV, and strong UV absorption is expected. The non-zero reflectance suggests that the ZnO NR films exhibit significant light scattering. Importantly, in comparison to ZnO, H:ZnO displays lower reflectance in the wavelength range between 400 and 700 nm. Since they have the same crystal structure and morphology, the lower reflectance should possibly be not due to light scattering effect, indicating that H:ZnO absorbs visible light. The visible light absorption for H:ZnO NRAs can be attributed to the introduction of impurity states in the band-gap of ZnO during hydrogenation. It is well known that ZnO is intrinsically of n-type due to the shallow donor interstitial zinc and deep donor oxygen vacancies ($V_O$), both of which have low formation enthalpy. Furthermore, hydrogenation could introduce additional $V_O$ and interstitial hydrogen ($H_i$). To prove the presence of these defects, the chemical composition and surface oxidation states of ZnO and H:ZnO NRAs were studied and compared by X-ray photoelectron spectroscopy (XPS). Only C, Zn and O signals are observed in the survey spectrum collected for H:ZnO NRAs. Carbon is believed to be included during sample preparation. The results confirm that hydrogenation did not introduce other impurities into ZnO. Their Zn $2p_{3/2}$ and Zn $2p_{1/2}$ lines are found at the binding energies of about 1021 and 1044 eV, which are consistent with the values reported for ZnO (FIG. 24a). Two distinct peaks were observed in the O 1s core level XPS spectra of ZnO and H:ZnO (FIG. 23b). While the peak centered at the binding energy of 529.9 eV is a characteristic value reported for Zn—O—Zn, the peaks centered at the binding energies of 531.4 (for ZnO) and 532.0 eV (for H:ZnO) could be attributed to $V_O$ or Zn—O—H. Their binding energies are typically slightly higher than the value reported for Zn—O—Zn. Significantly, H:ZnO shows a much stronger peak at a higher binding energy compared to ZnO, indicating an increased density of hydroxyl groups and $V_O$ on hydrogenated ZnO surface. Moreover, we compared the Raman spectra of ZnO and H:ZnO samples (FIG. 23c). While both of them show characteristic peaks for ZnO, the H:ZnO sample exhibits an additional broad peak between 525 and 700 $cm^{-1}$, which can be ascribed to the $V_O$ in ZnO. These results confirm the formation of $V_O$ during hydrogenation. Furthermore, the formation of $H_i$ in hydrogenated ZnO has been reported.

Electrochemical impedance measurements were conducted on the ZnO and H:ZnO samples in the dark to investigate the effect of hydrogenation on the electrical properties of ZnO. FIG. 23d displays the Mott-Schottky plots of ZnO and H:ZnO samples, which were generated based on capacitances that were derived from the electrochemical impedance obtained at each potential at 10 kHz frequency. According to the Mott-Schottky equation, the carrier densities of the ZnO and H:ZnO samples are calculated to be $1.7 \times 10^{20}$ $cm^{-3}$ and $6.9 \times 10^{20}$ $cm^{-3}$, respectively. The four-fold enhancement of carrier density in the H:ZnO sample could be attributed to the introduced $H_i$ and $V_O$ that have been reported to be shallow and deep donor, which lie 35 meV and 1 eV below the conduction band of ZnO.

Figure 25:
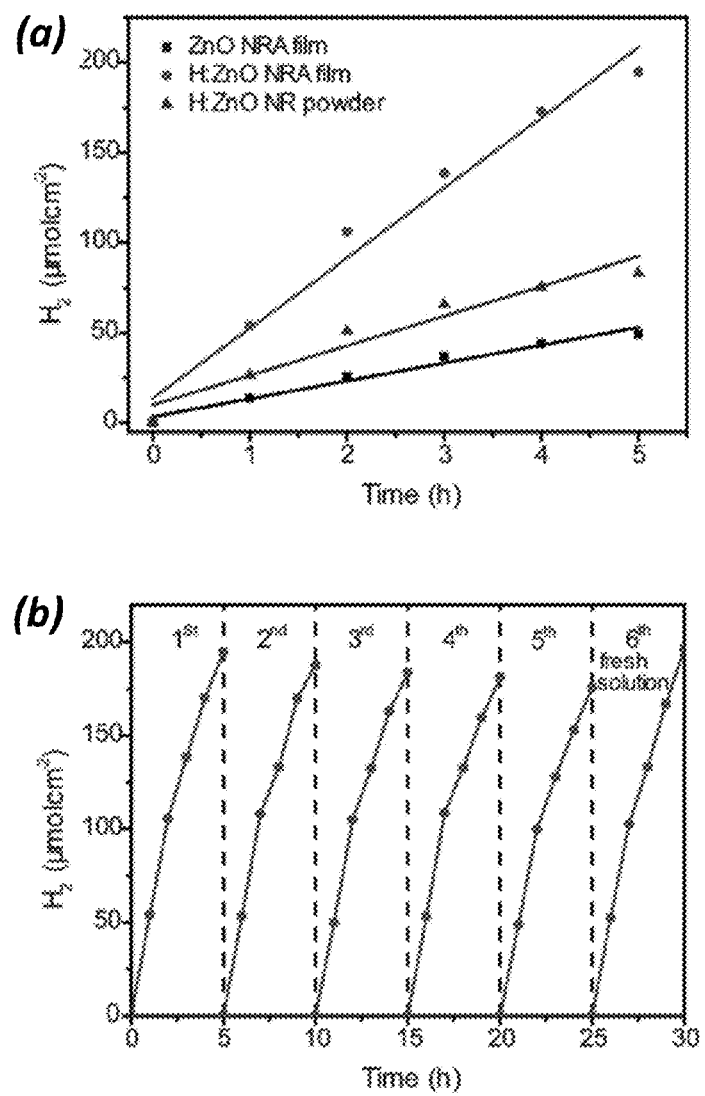
FIGS. 25a-25b show (a) Photocatalytic hydrogen production rate collected for ZnO NRA film, H:ZnO NRA film and H: ZnO NRs (powder) in a solution containing 0.1 M $Na_2SO_3$ and 0.1 M $Na_2S$ under white light irradiation. (b) Cycling performance of H:ZnO NRA films, according to embodiments of the invention.

To evaluate the photocatalytic activity of H:ZnO NRAs, the rate of hydrogen production was examined in a $Na_2S$—$Na_2SO_3$ electrolyte solution under white light illumination (a 300 W xenon lamp without filter). FIG. 25a shows the time-dependent photocatalytic hydrogen evolution collected for ZnO and H:ZnO samples. While the ZnO sample has an average hydrogen production rate of ~10 mmol $h^{-1}$ $cm^{-2}$, the H:ZnO sample shows a 5-fold increase in hydrogen evolution, achieving a remarkable production rate of 49 mmol $h^{-1}$ $cm^{-2}$. To directly compare the hydrogen evolution rate with the reported values, the mass of ZnO NRs on the FTO substrate was measured using inductively coupled plasma atomic emission spectroscopy. The mass loading of ZnO and H:ZnO NRs was measured to be 0.49 and 0.41 mg $cm^{-2}$, respectively. Based on the mass loading, the hydrogen evolution rate of 49 µmol $h^{-1}$ $cm^{-2}$ is equivalent to 122 500 µmol $h^{-1}$ $g^{-1}$. This is the best photocatalytic hydrogen evolution rate ever obtained for ZnO catalysts, which is about 40 times larger than the best reported values. Their photocatalytic activities were also examined under visible light irradiation ($\lambda \geq 420$ nm). However, obvious hydrogen evolution it was not observed. This result confirms that the enhanced photocatalytic activity of H:ZnO is not due to its visible light absorption but can be mainly attributed to the introduced defects ($V_O$ and $H_i$) and increased carrier density. It is known that the photocatalytic activities of semiconductors can be influenced significantly by their surface chemical states. The introduction of $H_i$ increases the carrier density of H:ZnO NRs that improves charge transport as well as charge transfer at the interface between ZnO and electrolyte. Additionally, $V_O$ is typically in the neutral charge state in n-type ZnO, while it can become doubly ionized to form $V_0^{2\cdot}$ after accepting two holes from the ZnO valence band. $V_O$ could act as a hole trap that could promote the separation of the electron-hole pairs, and thus reduce the electron-hole recombination loss.

While conventional photocatalysts are usually prepared in powder form, the photocatalytic activity of H:ZnO NRs suspended in solution was examined in order to directly compare to the reported values for ZnO powder. 1.64 mg of H: ZnO NR powders, equivalent to the mass loading on two pieces of H:ZnO NRA films, were collected from FTO substrates. The photocatalytic properties of these powders were measured under the same conditions as for H:ZnO NRA films. The hydrogen production rate of H:ZnO NR powders is calculated to be 18.8 µmol $h^{-1}$ $cm^{-2}$ (44 000 µmol $h^{-1}$ $g^{-1}$). While this value is smaller than that of H:ZnO NRA films, it is still substantially larger than the best reported values for ZnO powder catalysts. The improved hydrogen production rate for H:ZnO NRA films can be attributed to two possible reasons. First, H:ZnO NRAs grown on the FTO substrate retain their ordered structure, providing a large accessible surface area for photocatalytic reactions. Binding to a conducting film may also facilitate the separation of charge carriers. On the contrary, H:ZnO NRs formed aggregates in solution due to their high surface energy, resulting in a decrease in surface area (active sites). Second, the ordered H:ZnO structure forms surface electric fields between NRs that could reduce recombination of photo-excited electrons and holes, which has been reported for other ordered nanostructures.

In addition to high photocatalytic activity, good stability is another key factor for high-performance of photocatalysts. The time courses of photocatalytic hydrogen evolution over the same H:ZnO NRA film were recorded to evaluate its stability (FIG. 25b). Significantly, hydrogen production shows a linear relation with illumination time in the entire measurement, suggesting that gas production is persistent for continuous operation. Despite a small decrease in hydrogen production observed after the first five cycles, the amount of hydrogen production recovered upon replacing the electrolyte solution. Therefore, the gradual reduction of hydrogen production is due to the continuous consumption of $Na_2S$ and $Na_2SO_3$. The H:ZnO NRA films show excellent stability. Moreover, the collection and recycling of H:ZnO NRA films are exceptionally simple and efficient.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example, the hydrogen thermal treatment can also be used to improve the photoelectrochemical performance of other pristine metal oxides or element-doped metal oxides.

All such variations are considered to be within the scope and spirit of the present invention as defined by the following claims and their legal equivalents.

What is claimed:

1. A method of enhancing photoelectrochemical (PEC) performance, comprising:

a. annealing a PEC electrode in air, wherein said PEC electrode comprises rutile $TiO_2$, and a crystal metal oxide comprising crystalline $WO_3$ or crystalline $BiVO_4$, wherein said air-annealing of said PEC electrode comprises a temperature in a range of 500 to 550° C.;

b. hydrogenating said PEC electrode by annealing said PEC electrode in hydrogen to form a hydrogenated-PEC electrode, wherein said hydrogen-annealing of said PEC electrode comprises a temperature in a range of 300 to 400° C.; and c. introducing oxygen vacancies and hydrogen impurities to a PEC electrode, using said hydrogenation, wherein said hydrogenated PEC electrode comprises crystalline hydrogenated-$WO_3$, or crystalline hydrogenated-$BiVO_4$.

2. The method of electrode hydrogenation of claim 1, wherein said hydrogenated PEC electrode comprises a photoanode.

3. The method of electrode hydrogenation of claim 1, wherein said hydrogen-annealing of said PEC electrode comprises a hydrogen atmosphere having a purity of at least 99.99%.

4. The method of electrode hydrogenation of claim 1, wherein said hydrogen-annealing of said PEC electrode comprises a hydrogen atmosphere having a pressure in a range of 500 to 760 milli-torr.

5. The method of electrode hydrogenation of claim 1, wherein said air-annealing of said PEC electrode comprises an air atmosphere having a pressure of 760 mili-torr.

6. The method of electrode hydrogenation of claim 1, wherein said hydrogen-annealing of said PEC electrode comprises annealing for a duration in a range of 10 min to 2 h.

7. The method of electrode hydrogenation of claim 1, wherein said air-annealing of said PEC electrode comprises annealing for a duration in a range of 1 h to 3 h.

* * * * *